(12) United States Patent
Nomiyama et al.

(10) Patent No.: US 11,569,783 B2
(45) Date of Patent: *Jan. 31, 2023

(54) SYMBOL POWER TRACKING AMPLIFICATION SYSTEM AND A WIRELESS COMMUNICATION DEVICE INCLUDING THE SAME

(71) Applicant: SAMSUNG ELECTRONICS CO., LTD., Suwon-si (KR)

(72) Inventors: Takahiro Nomiyama, Seoul (KR); Ji-seon Paek, Suwon-si (KR); Dong-su Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 106 days.

This patent is subject to a terminal disclaimer.

(21) Appl. No.: 16/885,488

(22) Filed: May 28, 2020

(65) Prior Publication Data

US 2020/0321917 A1    Oct. 8, 2020

Related U.S. Application Data

(63) Continuation of application No. 16/504,475, filed on Jul. 8, 2019, now Pat. No. 10,686,407, which is a
(Continued)

(30) Foreign Application Priority Data

Apr. 30, 2018  (KR) .................... 10-2018-0050186
Apr. 24, 2019  (KR) .................... 10-2019-0048030

(51) Int. Cl.
*H04K 1/02*      (2006.01)
*H04L 25/03*    (2006.01)
(Continued)

(52) U.S. Cl.
CPC .......... *H03F 1/0222* (2013.01); *H02M 3/156* (2013.01); *H03F 3/183* (2013.01);
(Continued)

(58) Field of Classification Search
CPC ............ H03F 1/0222; H03F 3/21; H03F 3/19; H03F 3/183; H03F 1/0266; H04B 7/0452;
(Continued)

(56) References Cited

U.S. PATENT DOCUMENTS 6,535,066 B1   3/2003 Petsko
6,556,629 B1   4/2003 Evans
(Continued)

FOREIGN PATENT DOCUMENTS

CN     1377520      10/2002
CN     102142768    8/2011
(Continued)

OTHER PUBLICATIONS

European Search Report issued in corresponding European Patent Application No. EP 19 17 1551.5 dated Sep. 24, 2019.
(Continued)

*Primary Examiner* — Phuong Phu
(74) *Attorney, Agent, or Firm* — F. Chau & Associates, LLC

(57) ABSTRACT

A symbol power tracking amplification system including: a modem to generate data and symbol tracking signals; a symbol tracking modulator including a control circuit, first and second voltage supply circuits and a switch circuit, the control circuit generates first and second voltage level control signals in response to the symbol tracking signal, the first voltage supply circuit generates a first output voltage in response to the first voltage level control signal, the second voltage supply circuit generates a second output voltage in response to the second voltage level control signal and the
(Continued)

switch circuit outputs the first or second output voltages as a supply voltage in response to a switch control signal; an RF block to generate an RF signal based on the data signal from the modem; and a power amplifier to adjust a power level of the RF signal based on the supply voltage.

20 Claims, 24 Drawing Sheets

Related U.S. Application Data continuation-in-part of application No. 16/233,192, filed on Dec. 27, 2018, now abandoned.

(51) Int. Cl.
| | |
|---|---|
| H04L 25/49 | (2006.01) |
| H03F 1/02 | (2006.01) |
| H04B 7/0452 | (2017.01) |
| H02M 3/156 | (2006.01) |
| H03G 3/30 | (2006.01) |
| H03F 3/21 | (2006.01) |
| H03F 3/19 | (2006.01) |
| H03F 3/183 | (2006.01) |

(52) U.S. Cl.
CPC ............... *H03F 3/19* (2013.01); *H03F 3/21* (2013.01); *H03G 3/30* (2013.01); *H04B 7/0452* (2013.01)

(58) Field of Classification Search
CPC ..... H02M 3/156; H03G 3/30; H04L 27/2613; H01Q 1/28
USPC .................................................. 375/296, 297
See application file for complete search history.

(56) References Cited

U.S. PATENT DOCUMENTS

| | | | |
|---|---|---|---|
| 6,625,227 B1 | 9/2003 | Shull et al. | |
| 7,733,980 B2 | 6/2010 | Beukema et al. | |
| 7,899,142 B2 | 3/2011 | Hayashi et al. | |
| 8,718,188 B2 | 5/2014 | Balteanu et al. | |
| 8,744,382 B2 | 6/2014 | Hou et al. | |
| 8,981,847 B2 | 3/2015 | Balteanu | |
| 9,065,509 B1 | 6/2015 | Yan et al. | |
| 9,197,296 B2 | 11/2015 | Filipovic et al. | |
| 9,207,692 B2 | 12/2015 | Khlat et al. | |
| 9,280,163 B2 | 3/2016 | Kay et al. | |
| 9,288,098 B2 | 3/2016 | Yan et al. | |
| 9,451,566 B1 | 9/2016 | Morshedi et al. | |
| 9,461,590 B2 | 10/2016 | Langer | |
| 9,525,384 B2 | 12/2016 | Lee et al. | |
| 9,577,771 B1 | 2/2017 | Lashkarian et al. | |
| 10,090,808 B1 | 10/2018 | Henzler et al. | |
| 10,686,407 B2* | 6/2020 | Nomiyama | H04B 7/0452 |
| 11,082,273 B2 | 8/2021 | Nikopour | |
| 2002/0137482 A1 | 9/2002 | Takeyabu et al. | |
| 2007/0178860 A1 | 8/2007 | Sutardja | |
| 2009/0195477 A1* | 8/2009 | Thiam | H01Q 21/28 343/893 |
| 2011/0018628 A1 | 1/2011 | Yang et al. | |
| 2011/0058601 A1* | 3/2011 | Kim | H03F 1/0266 375/238 |
| 2013/0034186 A1 | 2/2013 | Oga | |
| 2013/0279629 A1 | 10/2013 | Seller | |
| 2014/0341318 A1 | 11/2014 | Pourkhaatoun et al. | |
| 2015/0156045 A1* | 6/2015 | Lee | H04L 27/2613 375/260 |
| 2015/0194936 A1 | 7/2015 | Inanoglu et al. | |
| 2016/0181995 A1 | 6/2016 | Nentwig et al. | |
| 2017/0005629 A1 | 1/2017 | Yang et al. | |
| 2017/0005676 A1 | 1/2017 | Yan et al. | |
| 2018/0159566 A1 | 6/2018 | Dinur et al. | |
| 2019/0074797 A1 | 3/2019 | Briffa et al. | |
| 2019/0274711 A1 | 9/2019 | Scoggins et al. | |
| 2019/0302817 A1 | 10/2019 | Rosolowski et al. | |
| 2019/0334480 A1 | 10/2019 | Nomiyama et al. | |

FOREIGN PATENT DOCUMENTS

| | | |
|---|---|---|
| CN | 103597741 | 2/2014 |
| CN | 104185953 | 12/2014 |
| EP | 3309959 | 4/2018 |
| GB | 2524243 | 9/2015 |
| TW | 200824376 | 6/2008 |
| TW | 201737655 | 10/2017 |

OTHER PUBLICATIONS

Chinese Office Action issued in corresponding CN Patent Application No. 201910361788.1 dated Jul. 13, 2022.

Taiwanese Office Action issued in corresponding TW Patent Application No. 108114997 dated Jun. 20, 2022.

\* cited by examiner

SYMBOL POWER TRACKING AMPLIFICATION SYSTEM AND A WIRELESS COMMUNICATION DEVICE INCLUDING THE SAME

CROSS-REFERENCE TO RELATED APPLICATIONS

This application is a continuation of U.S. patent application Ser. No. 16/504,475 filed on Jul. 8, 2019, which is a continuation in part of U.S. patent application Ser. No. 16/233,192, filed on Dec. 27, 2018, which claims priority under 35 U.S.C. § 119 to Korean Patent Application No. 10-2018-0050186, filed on Apr. 30, 2018, in the Korean Intellectual Property Office, and Korean Patent Application No. 10-2019-0048030, filed on Apr. 24, 2019, in the Korean Intellectual Property Office, the disclosures of which are incorporated by reference herein in their entireties.

TECHNICAL FIELD

The inventive concept relates to a symbol power tracking (SPT) amplification system, and more particularly, to an SPT amplification system supporting an SPT modulation technique and a wireless communication device including the SPT amplification system.

DISCUSSION OF RELATED ART

Wireless communication devices, such as smartphones, tablets, and Internet of Things (IOT) devices, use wideband code division multiple access (WCDMA) ($3^{rd}$ generation (3G)), long-term evolution (LTE), and LTE advanced ($4^{th}$ generation (4G)) techniques for high-speed communications. With the development of communication technology, transmitted/received signals require high peak-to-average power ratios (PAPRs) and high bandwidths. Accordingly, when a power source of a power amplifier of a transmitter is connected to a battery, efficiency of the power amplifier may be degraded. To increase the efficiency of the power amplifier at a high PAPR and a high bandwidth, an average power tracking (APT) technique or an envelope tracking (ET) modulation technique may be used.

ET is an approach to radio frequency (RF) amplifier design in which the power supply connected to the RF power amplifier is continuously adjusted to ensure that the amplifier is operating at peak efficiency for power required at each instance of transmission. When the ET modulation technique is used, efficiency and linearity of the power amplifier may be improved. A chip configured to support the APT technique and the ET modulation technique may be referred to as a supply modulator (SM).

Research is being conducted into $5^{th}$-generation (5G) communication techniques. 5G high-speed data communications, which are faster than 4G communication techniques, require an appropriate power modulation technique.

SUMMARY

According to an exemplary embodiment of the inventive concept, there is provided a symbol power tracking (SPT) amplification system including: a modem configured to generate a data signal and a symbol tracking signal in response to an external data signal; a symbol tracking modulator including a control circuit, a first voltage supply circuit, a second voltage supply circuit and a switch circuit, wherein the control circuit is configured to generate a first voltage level control signal and a second voltage level control signal in response to the symbol tracking signal, the first voltage supply circuit is configured to generate a first output voltage in response to the first voltage level control signal, the second voltage supply circuit is configured to generate a second output voltage in response to the second voltage level control signal and the switch circuit is configured to output one of the first and second output voltages as a supply voltage in response to a switch control signal provided from the control circuit, a radio frequency (RF) block configured to generate an RF signal based on the data signal from the modem; and a power amplifier configured to adjust a power level of the RF signal based on the supply voltage output from the symbol tracking modulator.

According to an exemplary embodiment of the inventive concept, there is provided a symbol tracking modulator including: a control circuit configured to generate a first reference voltage and a second reference voltage in response to a symbol tracking signal; a first voltage supply circuit configured to generate a first output voltage in response to the first reference voltage; a second voltage supply circuit configured to generate a second output voltage in response to the second reference voltage; and a switch circuit configured to output one of the first and second output voltages as a supply voltage in response to a switch control signal provided from the control circuit.

According to an exemplary embodiment of the inventive concept, there is provided a method of operating an SPT amplification system including: receiving, at a modem, communication environment information based on at least one parameter indicating a communication environment; determining, at the modem, a number of symbols included in a symbol group unit based on the communication environment information; and controlling, via the modem, the SPT amplification system based on the symbol group unit.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
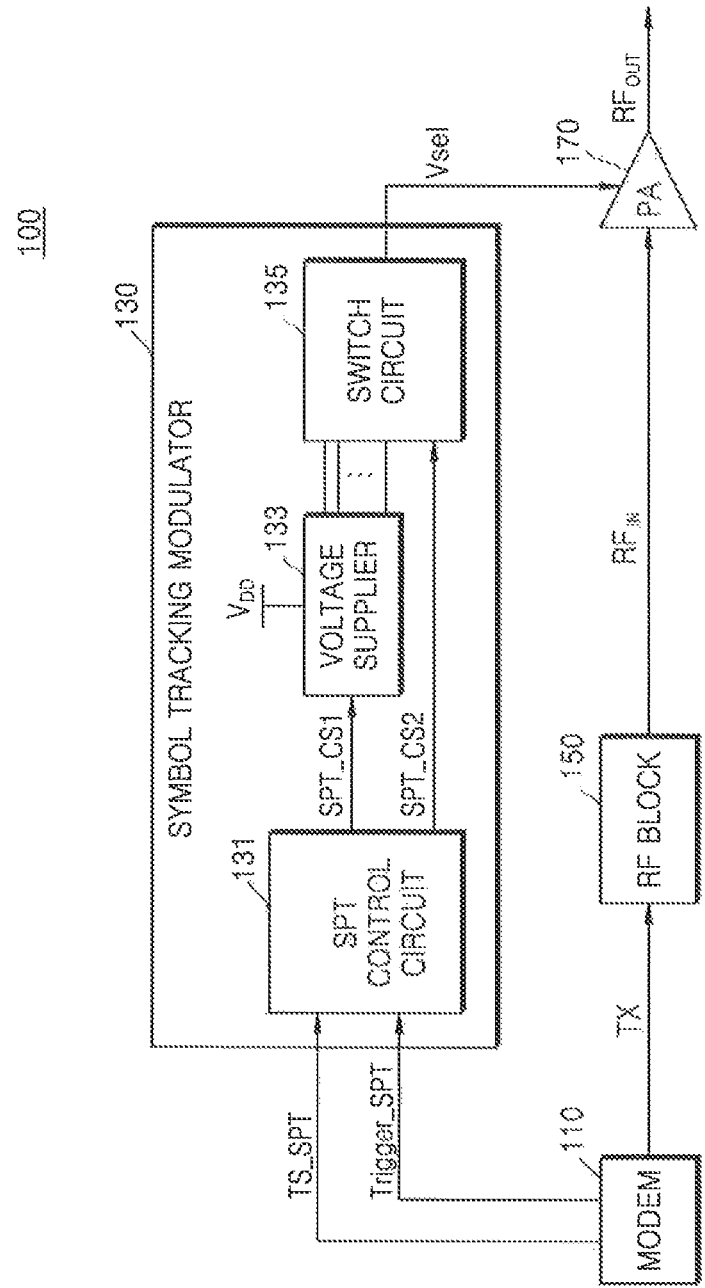
FIG. 1 is a schematic block diagram of a wireless communication device according to an exemplary embodiment of the inventive concept.

FIG. 1 is a schematic block diagram of a wireless communication device 100 according to an exemplary embodiment of the inventive concept.

Referring to FIG. 1, the wireless communication device 100 may include a modem 110, a symbol tracking modulator 130, a radio-frequency (RF) block 150, and a power amplifier (or PA) 170. A configuration including the symbol tracking modulator 130 and the power amplifier 170 may be a symbol power tracking (SPT) amplification system configured to amplify an RF signal $RF_{IN}$ and output an RF output signal $RF_{OUT}$. The modem 110 may process a baseband signal transmitted to and received from the wireless communication device 100. For example, the modem 110 may generate a digital data signal and a digital symbol tracking signal corresponding to the digital data signal in response to an external data signal. In this case, the digital symbol tracking signal may be generated based on a magnitude (or amplitude component) of the digital data signal. The modem 110 may perform digital-to-analog conversion (DAC) on the digital data signal and the digital symbol tracking signal and provide a data signal TX and a symbol tracking signal TS_SPT to the RF block 150 and the symbol tracking modulator 130, respectively. However, the symbol tracking signal TS_SPT provided by the modem 110 to the symbol tracking modulator 130 is not limited to an analog signal and may be a digital signal.

The data signal TX may correspond to a predetermined frame and include a plurality of symbols. A frame will be described in detail below with reference to FIG. 8. The modem 110 according to an exemplary embodiment of the inventive concept may divide the data signal TX into a plurality of symbol groups based on a symbol group unit including at least one symbol, and generate the symbol tracking signal TS_SPT based on a magnitude (or amplitude component) of a symbol included in each of the symbol groups. For example, when the symbol group unit includes only one symbol, the symbol group unit may be a symbol unit. The modem 110 may generate the symbol tracking signal TS_SPT based on the magnitude of each of the symbols of the data signal TX. The symbol tracking modulator 130 may provide a supply voltage for tracking the RF signal $RF_{IN}$ to the power amplifier 170 for each symbol section based on the symbol tracking signal TS_SPT. In addition, the modem 110 may provide a trigger signal Trigger_SPT corresponding to the symbol group unit to the symbol tracking modulator 130. The trigger signal Trigger_SPT may be used to inform the symbol tracking modulator 130 of a time point in which a new symbol group section begins. For example, when the symbol group unit includes only one symbol, the trigger signal Trigger_SPT may inform the symbol tracking modulator 130 of a time point at which each symbol of the data signal TX begins.

The modem 110 may variously determine (or change) the number of symbols included in the symbol group unit, and generate the symbol tracking signal TS_SPT and the trigger signal Trigger_SPT corresponding to the symbol group unit. A method of determining the symbol group unit of the modem 110 will be described below with reference to FIGS. 7 to 9.

The symbol tracking signal TS_SPT and the trigger signal Trigger_SPT may be variously implemented to control the symbol tracking modulator 130 to provide a selection supply voltage Vsel for tracking the RF signal $RF_{IN}$ to the power amplifier 170 for each symbol group section corresponding to the symbol group unit. The symbol tracking modulator 130 may perform an SPT operation based on the symbol tracking signal TS_SPT and the trigger signal Trigger_SPT. For example, the SPT operation may modulate a voltage level of the selection supply voltage Vsel based on a magnitude of the largest symbol of the data signal TX for each symbol group corresponding to the symbol group unit.

The symbol tracking modulator 130 may modulate the voltage level of the selection supply voltage Vsel provided to the power amplifier 170, based on the symbol tracking signal TS_SPT. For example, the symbol tracking modulator 130 may include an SPT control circuit 131, a voltage supplier 133, and a switch circuit 135. In an exemplary embodiment of the inventive concept, the SPT control circuit 131 may provide a first control signal SPT_CS1 and a second control signal SPT_CS2 to the voltage supplier 133 and the switch circuit 135, respectively, based on the symbol tracking signal TS_SPT and the trigger signal Trigger_SPT received from the modem 110.

The voltage supplier 133 may generate at least two supply voltages based on the first control signal SPT_CS1 using a power supply voltage $V_{DD}$ (or a battery voltage). A voltage level of each of the supply voltages may be changed in response to the first control signal SPT_CS1, and voltage levels of the respective supply voltages may be changed in different symbol group sections. The voltage supplier 133 may include a plurality of output terminals configured to output the supply voltages, respectively, and the output terminals of the voltage supplier 133 may be connected to the switch circuit 135.

The switch circuit 135 may include a plurality of switch elements, and select any one of the supply voltages generated by the voltage supplier 133, for each symbol group section corresponding to the symbol group unit, based on the second control signal SPT_CS2. For example, when the symbol group unit includes only one symbol, the switch circuit 135 may perform a switching operation of selecting any one of the supply voltages for each symbol section. The voltage supplier 133 may change voltage levels of the remaining supply voltages other than the supply voltage selected by the switch circuit 135, based on the first control signal SPT_CS1.

The RF block 150 may up-convert the data signal TX and generate the RF signal $RF_{IN}$. The power amplifier 170 may be driven due to the selection supply voltage Vsel, amplify the RF signal $RF_{IN}$, and generate the RF output signal $RF_{OUT}$. The RF output signal $RF_{OUT}$ may be provided to an antenna. As described above, the selection supply voltage Vsel may have a voltage-level transition pattern for tracking the data signal TX or the RF signal $RF_{IN}$ in units of symbol groups.

The symbol tracking modulator 130 according to an exemplary embodiment of the inventive concept may perform an SPT operation and perform an amplification operation of the power amplifier 170 to minimize deformation of a signal pattern of the RF signal $RF_{IN}$. In other words, the power amplifier 170 may output the RF output signal $RF_{OUT}$ in which the signal pattern of the RF signal $RF_{IN}$ is directly reflected, using the selection supply voltage Vsel, thereby improving communication performance between the wireless communication device 100 and a base station.

Figure 2A:
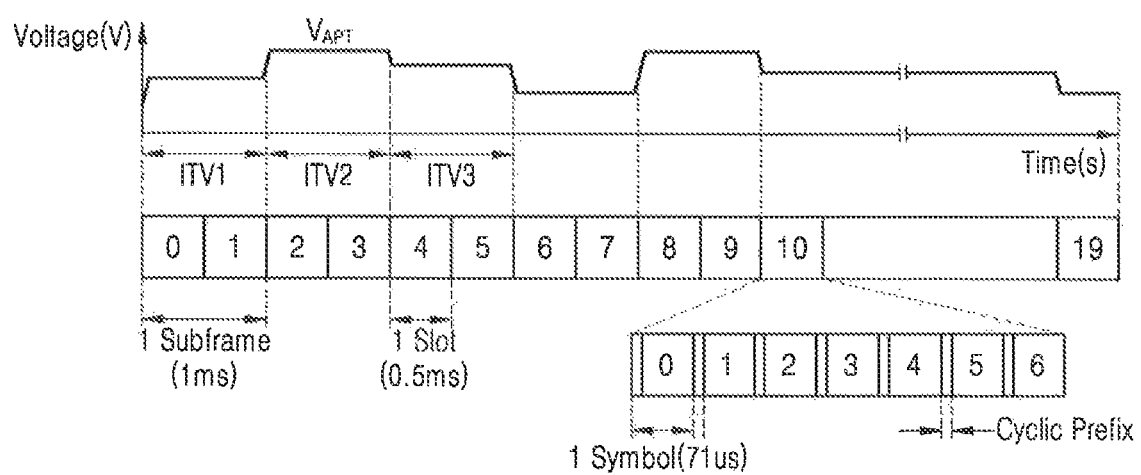
FIGS. 2A and 2B are diagrams illustrating an average power tracking technique.
Figure 2B:
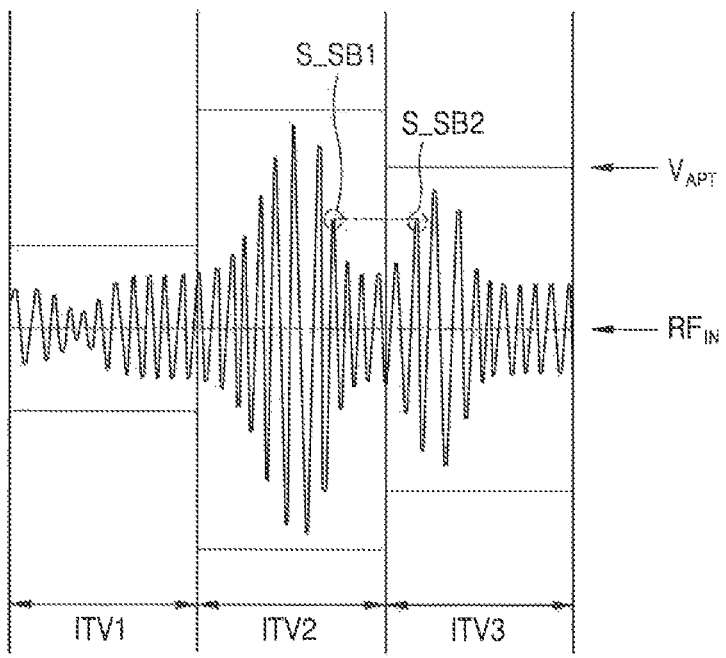

FIGS. 2A and 2B are diagrams illustrating an average power tracking technique. Hereinafter, it will be assumed that a frame of a data signal of a long-term evolution (LTE) system includes ten subframes, one subframe includes two slots, and one slot includes seven symbols.

Referring to FIG. 2A, the average power tracking technique may modulate a voltage level of a supply voltage $V_{APT}$ based on the highest magnitude (or amplitude) of the data signal for each subframe section. FIG. 2B shows a supply voltage $V_{APT}$ relative to an RF signal $RF_{IN}$ corresponding to each of first, second and third subframe sections ITV1, ITV2 and ITV3 of FIG. 2A according to the average power tracking technique. Referring to FIG. 2B, a first symbol S_SB1 of the RF signal $RF_{IN}$ in the second subframe section ITV2 may have the same magnitude as a second symbol S_SB2 of the RF signal $RF_{IN}$ in the third subframe section ITV3, while a level of a supply voltage $V_{APT}$ corresponding to the second subframe section ITV2 may be different from a level of a supply voltage $V_{APT}$ corresponding to the third subframe section ITV3. Since an amplification gain of an actual power amplifier is variable according to a level of the supply voltage $V_{APT}$, a magnitude of a signal output by the power amplifier after the first symbol S_SB1 is amplified may be different from a magnitude of a signal output by the power amplifier after the second symbol S_SB2 is amplified. In other words, when supply voltages $V_{APT}$ having different levels are provided to the power amplifier, even the same symbol may be amplified at different amplification gains to produce different results. Thus, communication reliability may be degraded. In particular, in a $5^{th}$-generation (5G) system, the communication of a symbol unit may be prerequisite for high-speed data communication in a high frequency bandwidth. Thus, a power tracking modulation technique with high data accuracy may be used in place of an average power tracking modulation technique. As shown in FIG. 2A, a subframe may be 1 ms, a slot may be 0.5 ms and a symbol may be 71 µs. In addition, a symbol may include a cyclic prefix.

Figure 3A:
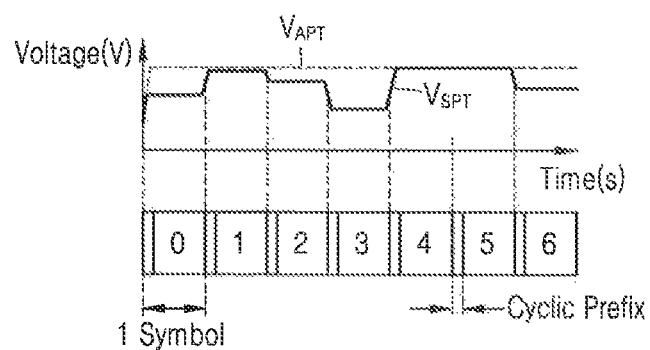
FIGS. 3A and 3B are diagrams illustrating a symbol power tracking (SPT) modulation technique according to exemplary embodiments of the inventive concept.
Figure 3B:
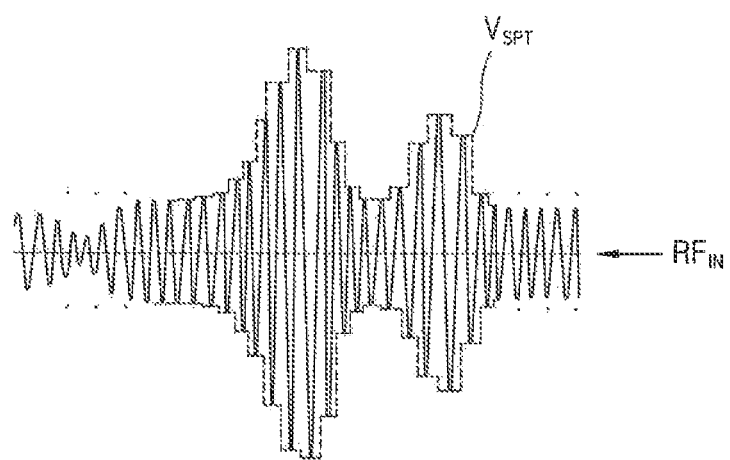

FIGS. 3A and 3B are diagrams illustrating an SPT modulation technique according to exemplary embodiments of the inventive concept.

Referring to FIG. 3A, an SPT modulation technique according to an exemplary embodiment of the inventive concept may be implemented using the modem 110 and the symbol tracking modulator 130 of FIG. 1, and a voltage level of a supply voltage $V_{SPT}$ may be modulated based on a magnitude (or amplitude) of a data signal for each symbol section by using the SPT modulation technique. A level transition of the supply voltage $V_{SPT}$ may be made within a cyclic prefix (CP) section of a symbol. However, the embodiment shown in FIG. 3A may pertain to a case in which a symbol group unit includes only one symbol. When the symbol group unit includes a plurality of symbols, a voltage level of a supply voltage $V_{SPT}$ may be modulated based on the highest magnitude of a data signal for each symbol group section including a plurality of symbols.

Referring to FIG. 3B, the symbol tracking modulator 130 of FIG. 1 may provide a supply voltage $V_{SPT}$ for tracking an RF signal $RF_{IN}$ in symbol units to the power amplifier 170. As a result, the SPT amplification system including the symbol tracking modulator 130 and the power amplifier 170 according to an exemplary embodiment of the inventive concept may precisely amplify the RF signal $RF_{IN}$ in units of symbol units and output an amplified signal. Thus, performance of communication with a base station may be improved.

Figure 4A:
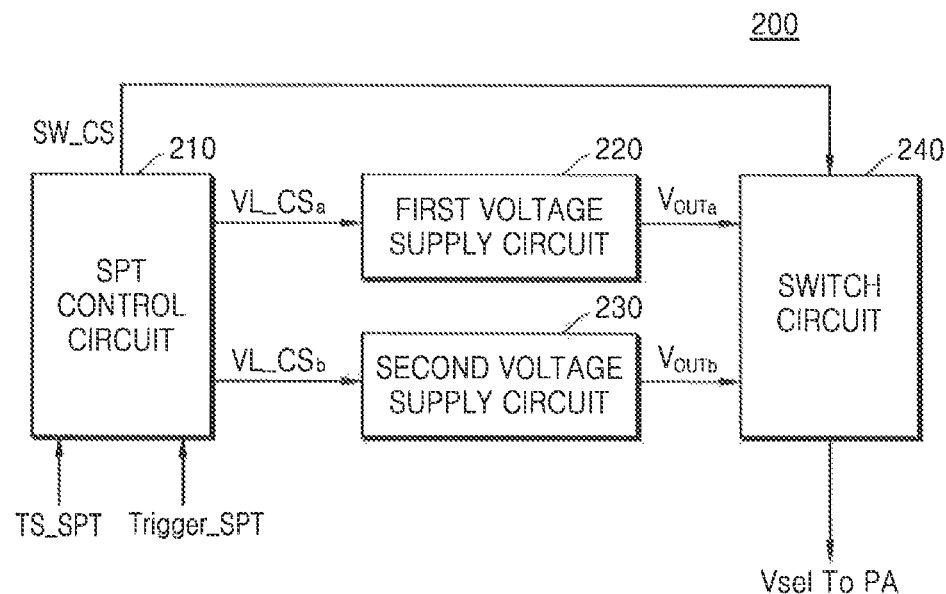
FIGS. 4A and 4B are block diagrams of a symbol tracking modulator according to exemplary embodiments of the inventive concept.
Figure 4B:
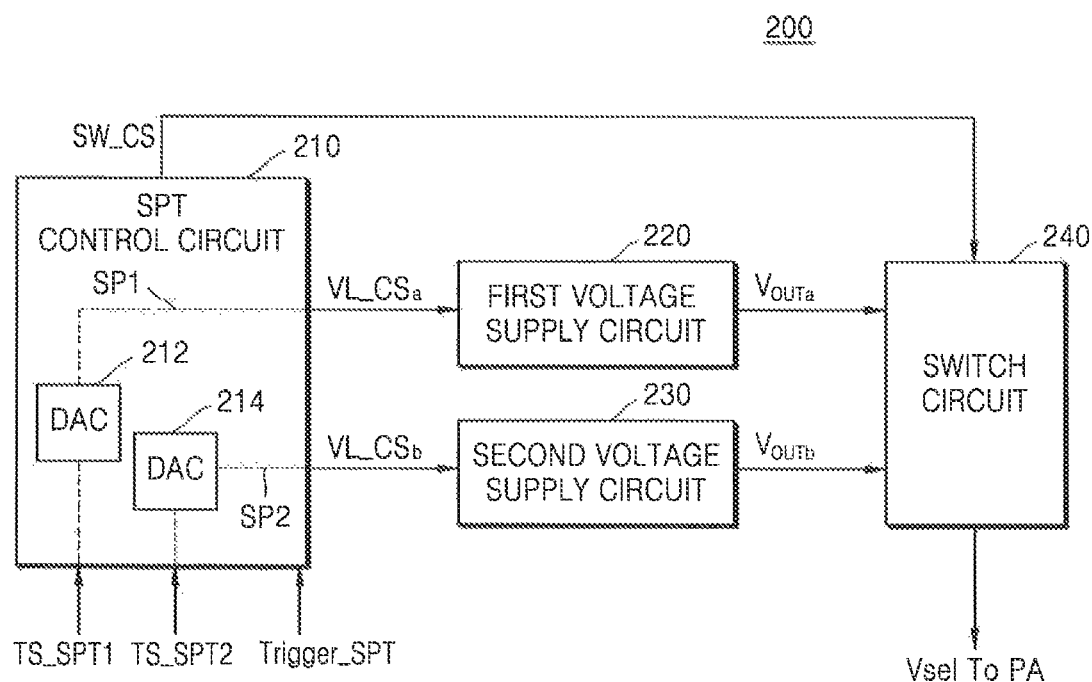

FIGS. 4A and 4B are block diagrams of a symbol tracking modulator 200 according to an exemplary embodiment of the inventive concept.

Referring to FIG. 4A, the symbol tracking modulator 200 may include an SPT control circuit 210, a first voltage supply circuit 220, a second voltage supply circuit 230, and a switch circuit 240. The SPT control circuit 210 may receive a symbol tracking signal TS_SPT and a trigger signal Trigger_SPT from a modem. The SPT control circuit 210 may generate a first voltage-level control signal $VL\_CS_a$ and a second voltage-level control signal $VL\_CS_b$ based on the symbol tracking signal TS_SPT and provide the first voltage-level control signal $VL\_CS_a$ and the second voltage-level control signal $VL\_CS_b$ to the first voltage supply circuit 220 and the second voltage supply circuit 230, respectively. In addition, the SPT control circuit 210 may generate a switching control signal SW_CS based on the trigger signal Trigger_SPT and provide the switching control signal SW_CS to the switch circuit 240. The SPT control circuit 210 may further include a timer. When the SPT control circuit 210 receives additional information about the number of symbols included in a symbol group unit from the modem, after receiving the trigger signal Trigger_SPT one time, the SPT control circuit 210 may count a time duration corresponding to the symbol group unit using the timer and periodically generate the switching control signal SW_CS based on the count result.

The first voltage supply circuit 220 may generate a first supply voltage $V_{OUTa}$ based on the first voltage-level control signal $VL\_CS_a$, and the second voltage supply circuit 230 may generate a second supply voltage $V_{OUTb}$ based on the second voltage-level control signal $VL\_CS_b$. The switch circuit 240 may alternately select the first voltage supply circuit 220 and the second voltage supply circuit 230 for each symbol group section based on the switching control signal SW_CS and connect the selected voltage supply circuit to a power amplifier PA. The first voltage supply circuit 220 may change a level of the first supply voltage $V_{OUTa}$ based on the first voltage-level control signal VL_CS$_a$ in a symbol group section in which the first voltage supply circuit 220 is selected. In addition, the second voltage supply circuit 230 may change a level of the second supply voltage $V_{OUTb}$ based on the second voltage-level control signal VL_CS$_b$ in a symbol group section in which the second voltage supply circuit 230 is selected. By using the above-described method, the switch circuit 240 may provide a selection supply voltage Vsel caused by SPT modulation to the power amplifier PA.

Referring to FIG. 4B, the symbol tracking signal TS_SPT of FIG. 4A may include a first symbol tracking signal TS_SPT1 and a second symbol tracking signal TS_SPT2. The first symbol tracking signal TS_SPT1 may control a level of the first supply voltage $V_{OUTa}$, and the second symbol tracking signal TS_SPT2 may control a level of the second supply voltage $V_{OUTb}$. In an exemplary embodiment of the inventive concept, the SPT control circuit 210 may include DAC circuits 212 and 214. The first symbol tracking signal TS_SPT1 and the second symbol tracking signal TS_SPT2 may be converted by the DAC circuits 212 and 214 into the first voltage-level control signal VL_CS$_a$ and the second voltage-level control signal VL_CS$_b$, respectively. However, in an exemplary embodiment of the inventive concept, when the first symbol tracking signal TS_SPT1 and the second symbol tracking signal TS_SPT2 are analog signals, the first symbol tracking signal TS_SPT1 and the second symbol tracking signal TS_SPT2 may be the same signals as the first voltage-level control signal VL_CS$_a$ and the second voltage-level control signal VL_CS$_b$, respectively.

The SPT control circuit 210 may receive the first symbol tracking signal TS_SPT1 through a first signal path SP1 and route the first symbol tracking signal TS_SPT1 to the first voltage supply circuit 220. In addition, the SPT control circuit 210 may receive the second symbol tracking signal TS_SPT2 through a second signal path SP2 and route the second symbol tracking signal TS_SPT2 to the second voltage supply circuit 230.

A relationship between the first symbol tracking signal TS_SPT1 and the second symbol tracking signal TS_SPT2 to implement an SPT modulation technique will now be described. A time point at which a level of the first symbol tracking signal TS_SPT1 is changed may be different from a time point at which a level of the second symbol tracking signal TS_SPT2 is changed. In addition, an interval between the time point at which the level of the first symbol tracking signal TS_SPT1 is changed and the time point at which the level of the second symbol tracking signal TS_SPT2 is changed may correspond to a length of the symbol group unit. In other words, the modem may provide a plurality of symbol tracking signals (e.g., TS_SPT1 and TS_SPT2) through a plurality of signal paths (e.g., SP1 and SP2) to the symbol tracking modulator 200.

Figure 5:
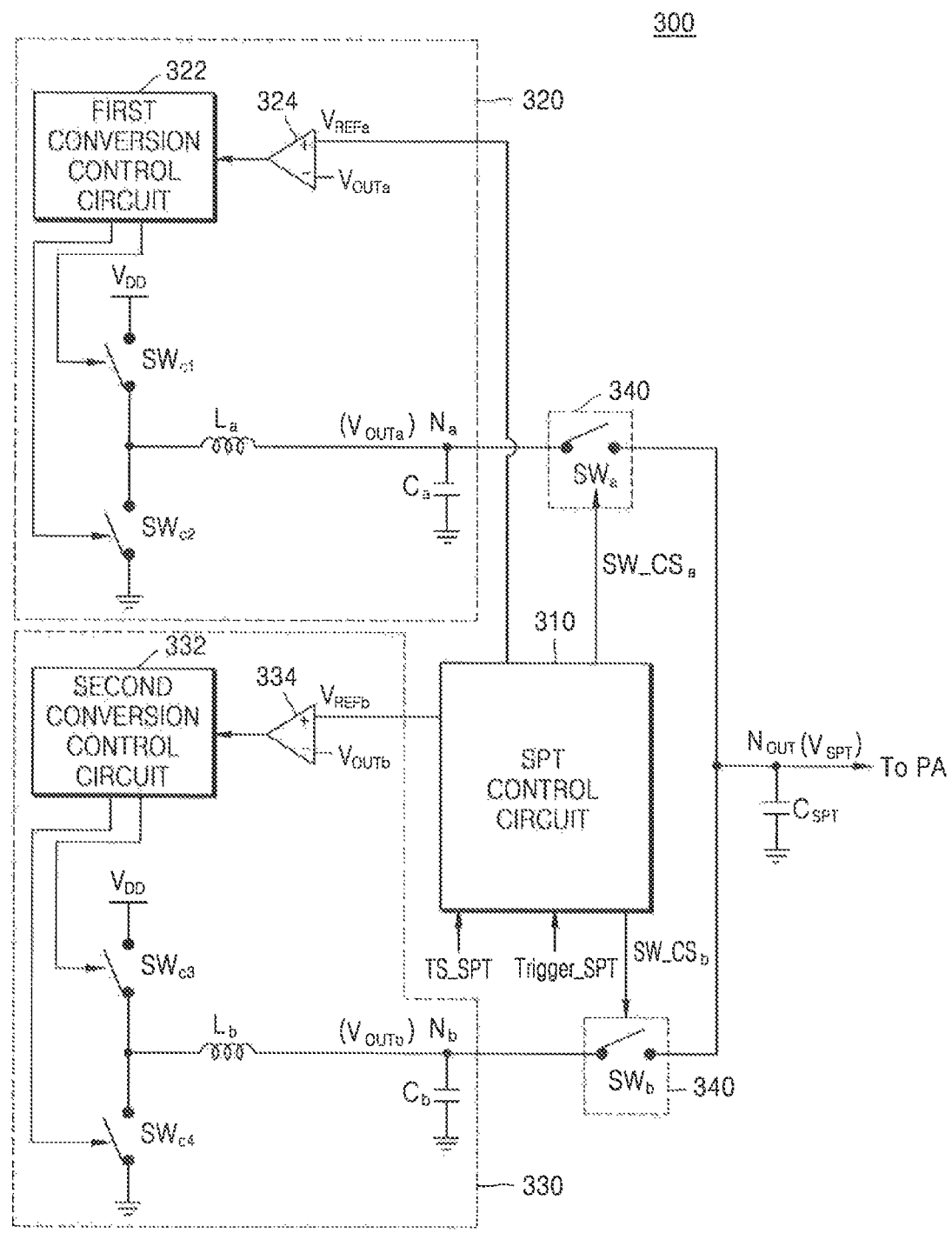
FIG. 5 is a circuit diagram of a symbol tracking modulator according to an exemplary embodiment of the inventive concept.

FIG. 5 is a circuit diagram of a symbol tracking modulator 300 according to an exemplary embodiment of the inventive concept.

Referring to FIG. 5, the symbol tracking modulator 300 may include an SPT control circuit 310, a first direct current (DC)-DC converter 320, a second DC-DC converter 330, a switch circuit 340, and an output capacitor element $C_{SPT}$. The first DC-DC converter 320 and the second DC-DC converter 330 may support a dynamic voltage scaling (DVS)

function. The first DC-DC converter 320 may include a first conversion control circuit 322, a first comparator 324, a plurality of switch elements (e.g., SW$_{e1}$ and SW$_{e2}$), an inductor element $L_a$, and a capacitor element $C_a$. The second DC-DC converter 330 may include a second conversion control circuit 332, a second comparator 334, a plurality of switch elements (e.g., SW$_{c3}$ and SW$_{c4}$), an inductor element $L_b$, and a capacitor element $C_b$.

The SPT control circuit 310 may provide a first reference voltage $V_{REFa}$ and a second reference voltage $V_{REFb}$ to the first comparator 324 and the second comparator 334, respectively, based on a symbol tracking signal TS_SPT. The first comparator 324 may receive a first supply voltage $V_{OUTa}$ of an output node $N_a$ of the first DC-DC converter 320, compare the first reference voltage $V_{REFa}$ with the first supply voltage $V_{OUTa}$, and provide the comparison result to the first conversion control circuit 322. The first conversion control circuit 322 may control a switching operation of the switch elements SW$_{c1}$ and SW$_{c2}$ based on the comparison result, and the first DC-DC converter 320 may generate the first supply voltage $V_{OUTa}$ corresponding to the first reference voltage $V_{REFa}$. The second comparator 334 may receive a second supply voltage $V_{OUTb}$ of an output node $N_b$ of the second DC-DC converter 330, compare the second reference voltage $V_{REFb}$ with the second supply voltage $V_{OUTb}$, and provide the comparison result to the second conversion control circuit 332. The second conversion control circuit 332 may control a switching operation on the switch elements SW$_{c3}$ and SW$_{c4}$ based on the comparison result, and the second DC-DC converter 330 may generate the second supply voltage $V_{OUTb}$ corresponding to the second reference voltage $V_{REFb}$.

The switch circuit 340 may include a plurality of switch elements (e.g., SW$_a$ and SW$_b$). A first switch element SW$_a$ of the switch circuit 340 may be connected between the first DC-DC converter 320 and an output node $N_{OUT}$ (or an output terminal) of the symbol tracking modulator 300. A second switch element SW$_b$ of the switch circuit 340 may be connected between the second DC-DC converter 330 and the output node $N_{OUT}$ of the symbol tracking modulator 300. The SPT control circuit 310 may generate a first switching control signal SW_CS$_a$ and a second switching control signal SW_CS$_b$ based on a trigger signal Trigger_SPT and provide the first switching control signal SW_CS$_a$ and the second switching control signal SW_CS$_b$ to the first switch element SW$_a$ and the second switch element SW$_b$, respectively. The switch circuit 340 may alternately select the first supply voltage $V_{OUTa}$ and the second supply voltage $V_{OUTb}$ based on switching control signals SW_CS$_a$ and SW_CS$_b$ and provide a selection supply voltage Vsel through the output node $N_{OUT}$ to the power amplifier PA. The output capacitor element $C_{SPT}$ may be connected to the output node $N_{OUT}$ to prevent a sudden voltage blank during a switching operation using the switch circuit 340.

Figure 6:
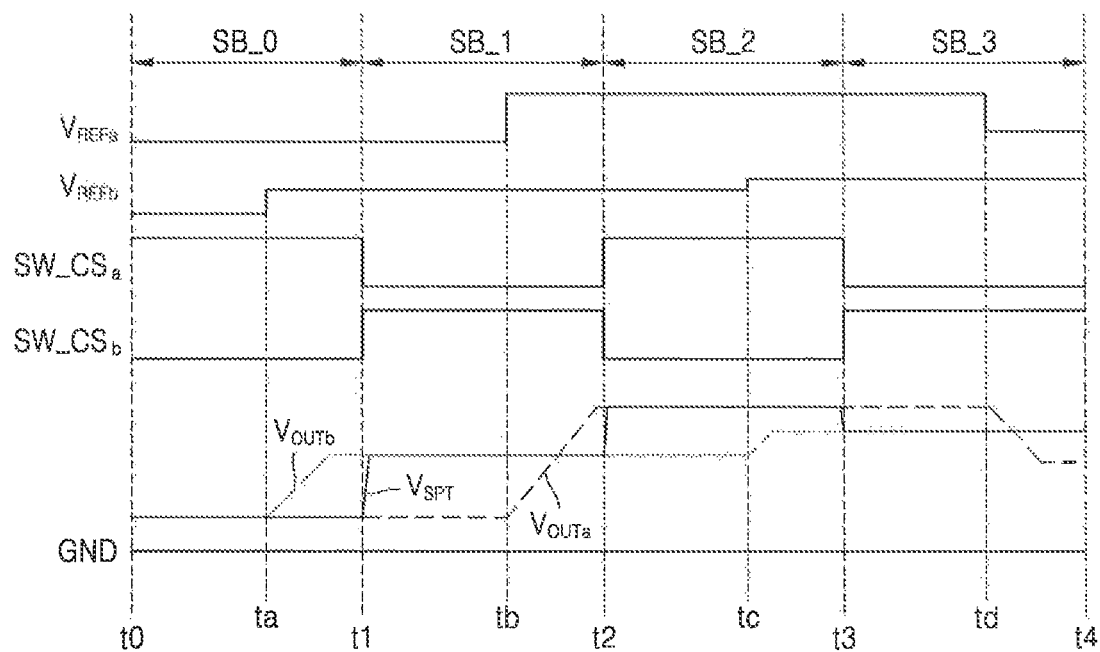
FIG. 6 is a diagram of signals for the symbol tracking modulator of FIG. 5 to perform operations.

FIG. 6 is a diagram of signals for the symbol tracking modulator 300 of FIG. 5 to perform operations. Hereinafter, it will be assumed that a symbol group unit includes only one symbol. Ground is represented by GND in the figures.

Referring to FIGS. 5 and 6, in a first symbol section SB_0 (or a section between a time point 't0' and a time point 't1'), the SPT control circuit 310 may provide a first reference voltage $V_{REFa}$, which is maintained at a constant level, to the first DC-DC converter 320 based on a symbol tracking signal TS_SPT, provide a first switching control signal SW_CS$_a$ having a high level to the first switch element SW$_a$ based on a trigger signal Trigger_SPT that is received at the time point 't0,' and provide a first supply voltage $V_{OUTa}$ generated by the first DC-DC converter 320 as a selection supply voltage $V_{SPT}$ to the power amplifier PA. In the first symbol section SB_0, the SPT control circuit 310 may provide a second reference voltage $V_{REFb}$ of which a level is changed at a time point 'ta' to the second DC-DC converter 330 based on the symbol tracking signal TS_SPT, provide a second switching control signal SW_CS$_b$ having a low level to the second switch element SW$_b$ based on the trigger signal Trigger_SPT that is received at the time point 't0,' and change a level of the second supply voltage $V_{OUTb}$ generated by the second DC-DC converter 330. For example, a level of the second supply voltage $V_{OUTb}$ may be increased.

In a second symbol section SB_1 (a section between the time point 't1' and a time point 't2'), the SPT control circuit 310 may provide a second reference voltage $V_{REFb}$, which is maintained at a constant level, to the second DC-DC converter 330 based on the symbol tracking signal TS_SPT, provide a second switching control signal SW_CS$_b$ having a high level to the second switch element SW$_b$ based on a trigger signal Trigger_SPT that is received at the time point 't1,' and provide a second supply voltage $V_{OUTb}$ generated by the second DC-DC converter 330 as a selection supply voltage $V_{SPT}$ to the power amplifier PA. In the second symbol section SB_1, the SPT control circuit 310 may provide a first reference voltage $V_{REFa}$ of which a level is changed at a time point 'tb' to the first DC-DC converter 320 based on the symbol tracking signal TS_SPT, provide a first switching control signal SW_CS$_a$ having a low level to the first switch element SW$_a$ based on the trigger signal Trigger_SPT that is received at the time point 't1,' and change a level of the first supply voltage $V_{OUTa}$ generated by the first DC-DC converter 320. For example, a level of the first supply voltage $V_{OUTa}$ may be increased.

In a third symbol section SB_2 (a section between the time point 't2' and a time point 't3,' the SPT control circuit 310 may provide a first reference voltage $V_{REFa}$, which is maintained at a constant level, to the first DC-DC converter 320 based on the symbol tracking signal TS_SPT, provide a first switching control signal SW_CS$_a$ having a high level to the first switch element SW$_a$ based on a trigger signal Trigger_SPT that is received at the time point 't2,' and provide a first supply voltage $V_{OUTa}$ generated by the first DC-DC converter 320 as a selection supply voltage $V_{SPT}$ to the power amplifier PA. In the third symbol section SB_2, the SPT control circuit 310 may provide a second reference voltage $V_{REFb}$ of which a level is changed at a time point 'tc' to the second DC-DC converter 330 based on the symbol tracking signal TS_SPT, provide a second switching control signal SW_CS$_b$ having a low level to the second switch element SW$_b$ based on the trigger signal Trigger_SPT that is received at the time point 't2,' and change a level of a second supply voltage $V_{OUTb}$ generated by the second DC-DC converter 330. For example, a level of the second supply voltage $V_{OUTb}$ may be increased.

In a fourth symbol section SB_3 (a section between the time point 't3' and a time point 't4'), the SPT control circuit 310 may provide a second reference voltage $V_{REFb}$, which is maintained at a constant level, to the second DC-DC converter 330 based on the symbol tracking signal TS_SPT, provide a second switching control signal SW_CS$_b$ having a high level to the second switch element SW$_b$ based on a trigger signal Trigger_SPT that is received at the time point 't3,' and provide a second supply voltage $V_{OUTb}$ generated by the second DC-DC converter 330 as a selection supply voltage $V_{SPT}$ to the power amplifier PA. In the fourth symbol section SB_3, the SPT control circuit 310 may provide a first reference voltage $V_{REFa}$ of which a level is changed at a time point 'td' to the first DC-DC converter 320 based on the symbol tracking signal TS_SPT, provide a first switching control signal SW_CS$_a$ having a low level to the first switch element SW$_a$ based on the trigger signal Trigger_SPT that is received at the time point 't3,' and change a level of a first supply voltage $V_{OUTa}$ generated by the first DC-DC converter 320. For example, a level of the first supply voltage $V_{OUTa}$ may be decreased.

In the above-described method, the symbol tracking modulator 300 may alternately select the first supply voltage $V_{OUTa}$ and the second supply voltage $V_{OUTb}$ as a selection supply voltage $V_{SPT}$ for each symbol section and pre-change a voltage level of an unselected supply voltage to perform an SPT modulation operation.

Figure 7A:
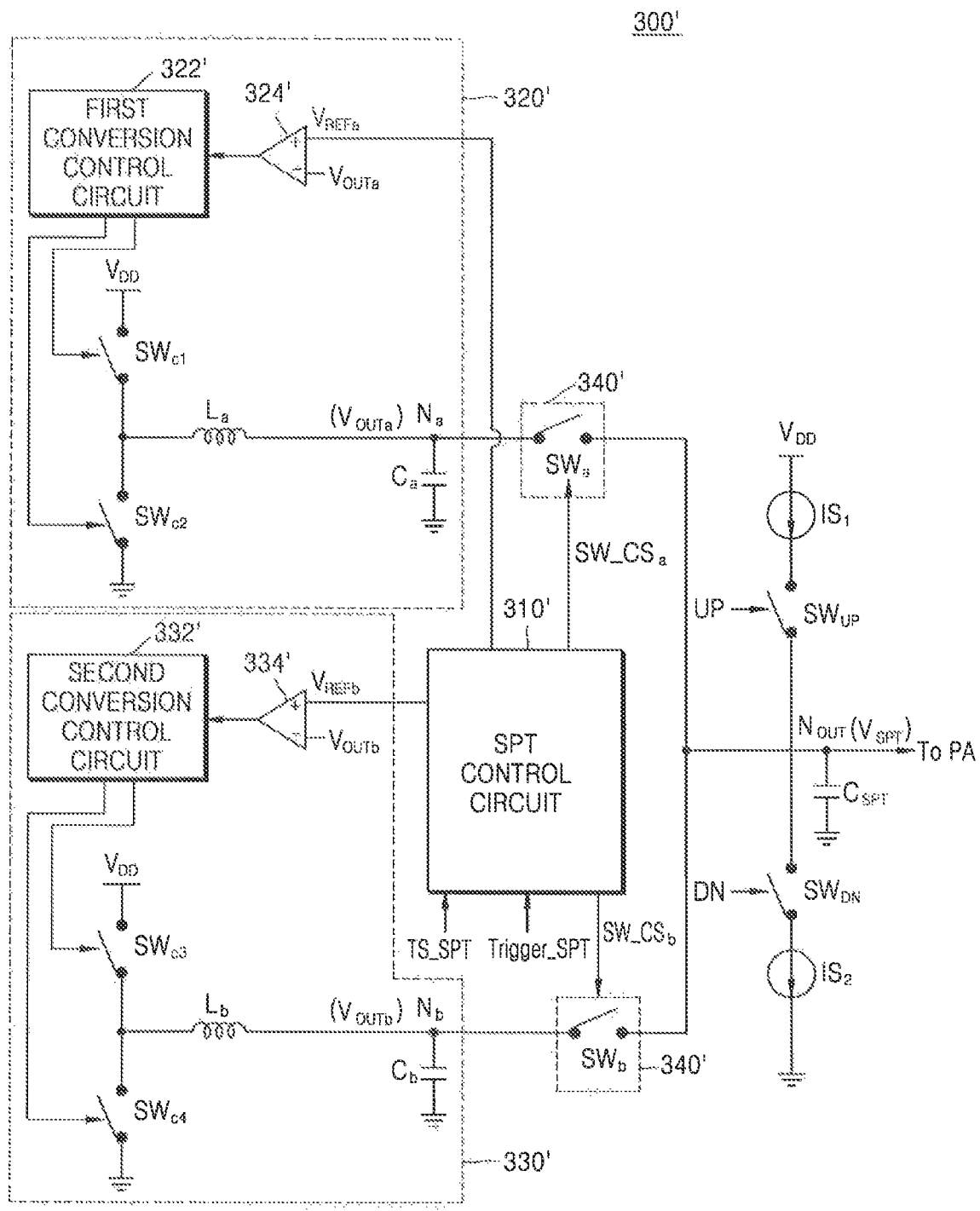
FIG. 7A is a circuit diagram of a symbol tracking modulator capable of fast charge control, according to an exemplary embodiment of the inventive concept.
Figure 7B:
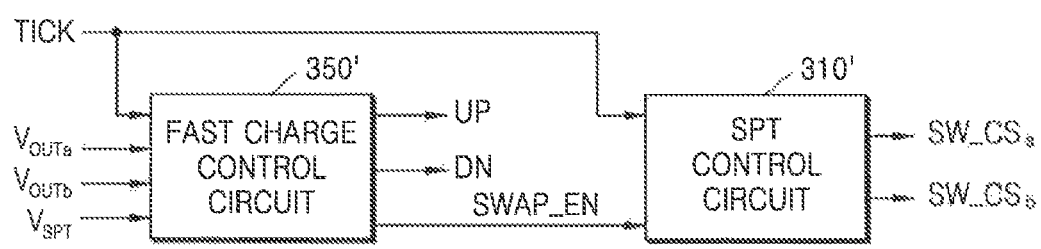
FIG. 7B is a block diagram illustrating an operation of a fast charge control circuit configured to perform fast charge control according to an exemplary embodiment of the inventive concept.

FIG. 7A is a circuit diagram of a symbol tracking modulator 300' capable of fast charge control, according to an exemplary embodiment of the inventive concept, and FIG. 7B is a block diagram illustrating an operation of a fast charge control circuit 350' configured to perform fast charge control according to an exemplary embodiment of the inventive concept.

Referring to FIG. 7A, as compared with the symbol tracking modulator 300 of FIG. 5, the symbol tracking modulator 300' may further include a first current source IS$_1$, a second current source IS$_2$, a first fast charge control switch SW$_{UP}$, and a second fast charge control switch SW$_{DN}$. In an exemplary embodiment of the inventive concept, the first current source IS$_1$ may rapidly charge an output node N$_{OUT}$ before a first switch element SW$_a$ or a second switch element SW$_b$ is turned on, so that a voltage $V_{SPT}$ of the output node N$_{OUT}$ may previously reach close to a first supply voltage $V_{OUTa}$ of an output node N$_a$ of a first DC-DC converter 320' or a second supply voltage $V_{OUTb}$ of an output node N$_b$ of a second DC-DC converter 330'. The second current source IS$_2$ may rapidly discharge the output node N$_{OUT}$ before the first switch element SW$_a$ or the second switch element SW$_b$ is turned on, so that the voltage $V_{SPT}$ of the output node N$_{OUT}$ may previously reach close to the first supply voltage $V_{OUTa}$ of the output node N$_a$ of the first DC-DC converter 320' or the second supply voltage $V_{OUTb}$ of the output node N$_b$ of the second DC-DC converter 330'. The control of the charging and discharging of the output node N$_{OUT}$ using the first current source IS$_1$ and the second current source IS$_2$ may be referred to as fast charge control. That is, due to the configuration of the first current source IS$_1$, the second current source IS$_2$, the first fast charge control switch SW$_{UP}$, and the second fast charge control switch SW$_{DN}$, the voltage $V_{SPT}$ of the output node N$_{OUT}$ may rapidly reach close to the first supply voltage $V_{OUTa}$ or the second supply voltage $V_{OUTb}$. Thus, a time taken for the voltage $V_{SPT}$ of the output node N$_{OUT}$ to transition to a target voltage may be reduced. Also, when the first and second switch elements SW$_a$ and SW$_b$ are connected, the occurrence of a rush current due to big voltage differences between the output node N$_{OUT}$ and other output nodes N$_a$ and N$_b$ may be prevented. In FIG. 7A, the first conversion control circuit and the second conversion control circuit are denoted by reference numerals 322' and 332', respectively, and the first comparator and the second comparator are denoted by reference numerals 324' and 334, respectively.

Referring to FIG. 7B, as compared with the symbol tracking modulator 300 of FIG. 5, the symbol tracking modulator 300' may further include a fast charge control circuit 350'. The fast charge control circuit 350' may generate any one of a first fast charge switching control signal UP and a second fast charge switching control signal DN based on a difference between a target voltage (e.g., the first supply voltage $V_{OUTa}$ or the second supply voltage $V_{OUTb}$) and the voltage $V_{SPT}$ of the output node $N_{OUT}$ in response to a trigger signal TICK for triggering a transition of symbol power, and output the generated signal to any one of the first fast charge control switch $SW_{UP}$ and the second fast charge control switch $SW_{DN}$. In addition, the fast charge control circuit 350' may detect whether the voltage $V_{SPT}$ of the output node $N_{OUT}$ has been charged or discharged to be close to the target voltage. When the voltage $V_{SPT}$ of the output node $N_{OUT}$ is detected to be close to the target voltage, the fast charge control circuit 350' may provide an enable signal SWAP_EN to an SPT control circuit 310' so that the SPT control circuit 310' may generate switching control signals $SW\_CS_a$ and $SW\_CS_b$ for controlling on/off operations of the first switch element $SW_a$ or the second switch element $SW_b$.

The configurations for fast charge control, which are shown in FIGS. 7A and 7B, are only example embodiments, and the inventive concept is not limited thereto. Various configurations that use a voltage $V_{SPT}$ for tracking a fast transition of symbol power, and that simultaneously prevent the occurrence of a rush current, may be applied to embodiments of the inventive concept.

Figure 8:
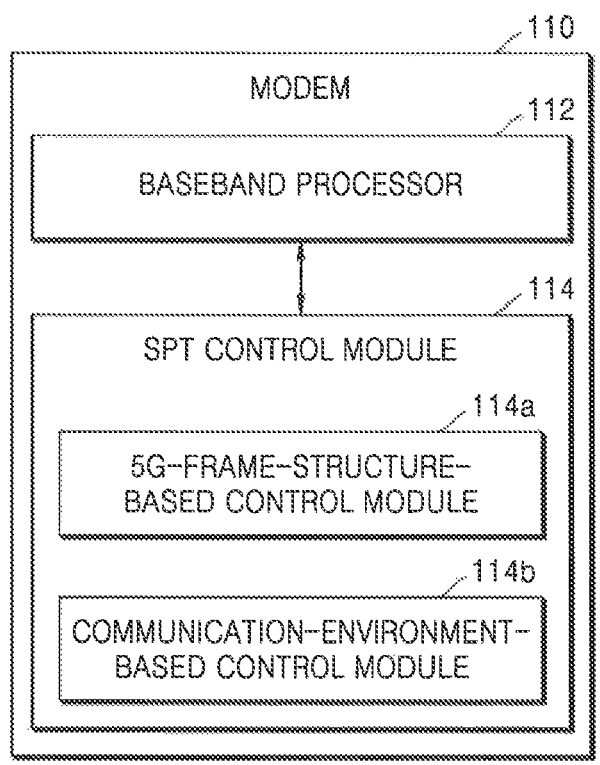
FIG. 8 is a block diagram of a modem according to an exemplary embodiment of the inventive concept.

FIG. 8 is a block diagram of a modem 110 according to an exemplary embodiment of the inventive concept. To control the SPT control circuit 131 shown in FIG. 1, the modem 110 may be implemented as shown in FIG. 8.

Referring to FIG. 8, the modem 110 may include a baseband processor 112 and an SPT control module 114. The SPT control module 114 may be software executed by the baseband processor 112 and be stored in a predetermined memory region of the modem 110. Furthermore, the SPT control module 114 may be implemented as hardware and control an SPT modulation operation separately from the baseband processor 112.

In an exemplary embodiment of the inventive concept, the SPT control module 114 may include a 5G-frame-structure-based control module 114a and a communication-environment-based control module 114b. The baseband processor 112 may execute the 5G-frame-structure-based control module 114a, determine (or change) the number of symbols included in a symbol group unit based on a frame structure of a 5G system, and generate a symbol tracking signal and a trigger signal based on the determined symbol group unit. In addition, the baseband processor 112 may execute the communication-environment-based control module 114b, determine (or change) the number of symbols included in a symbol group unit based on at least one of parameters indicating communication environments between a base station and a wireless communication device, and generate a symbol tracking signal and a trigger signal based on the determined symbol group unit. In other words, the baseband processor 112 may generate the symbol tracking signal TS_SPT and the trigger signal Trigger_SPT using the 5G-frame-structure-based control module 114a or the communication-environment-based control module 114b.

However, the inventive concept is not limited thereto. For example, the baseband processor 112 may periodically variously change the symbol group unit based on various parameters.

Figure 9:
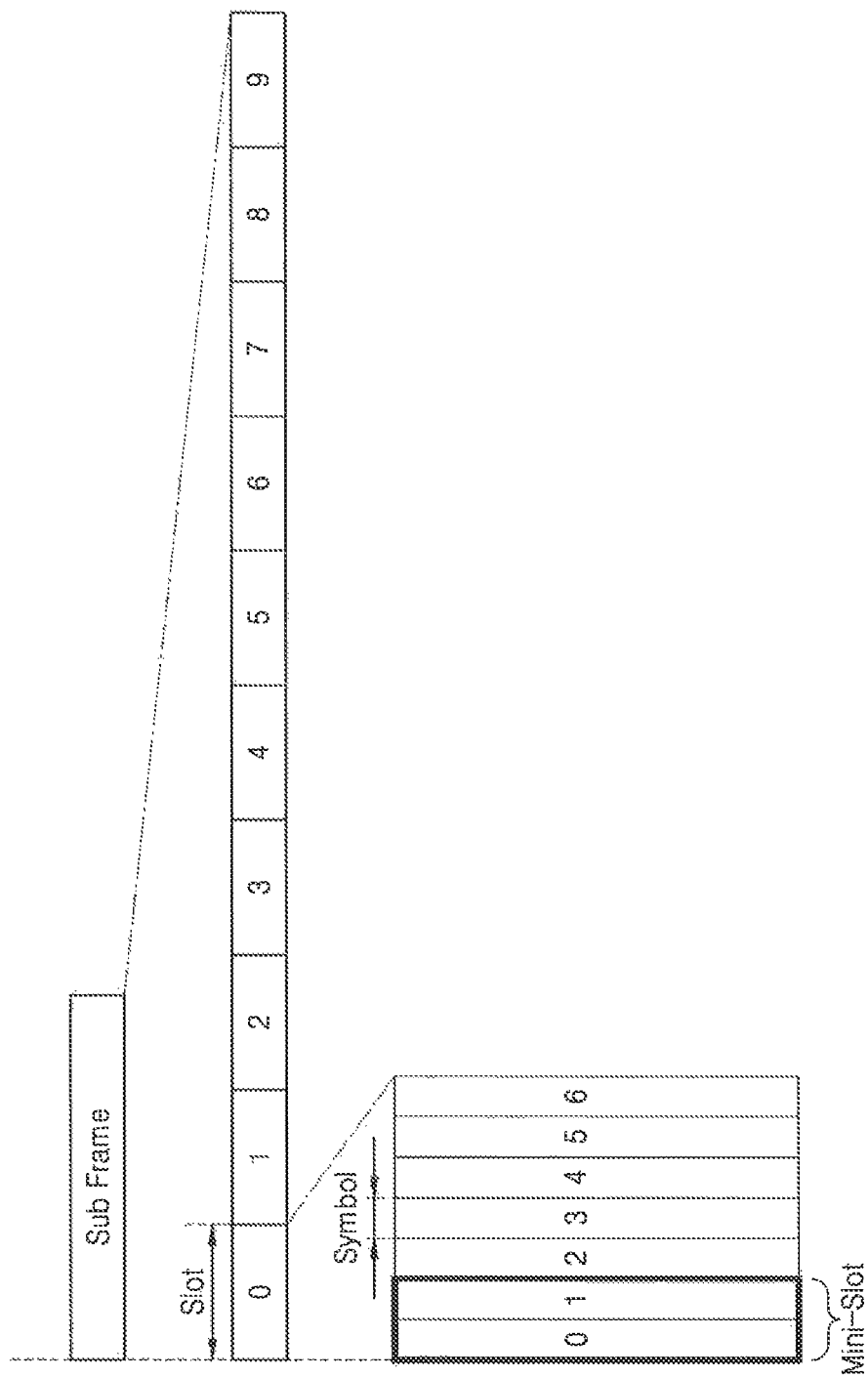
FIG. 9 is a diagram of a 5$^{th}$-generation (5G)-based frame structure, which is used to illustrate a method of determining a symbol group unit based on the 5G-based frame structure.
Figure 10:
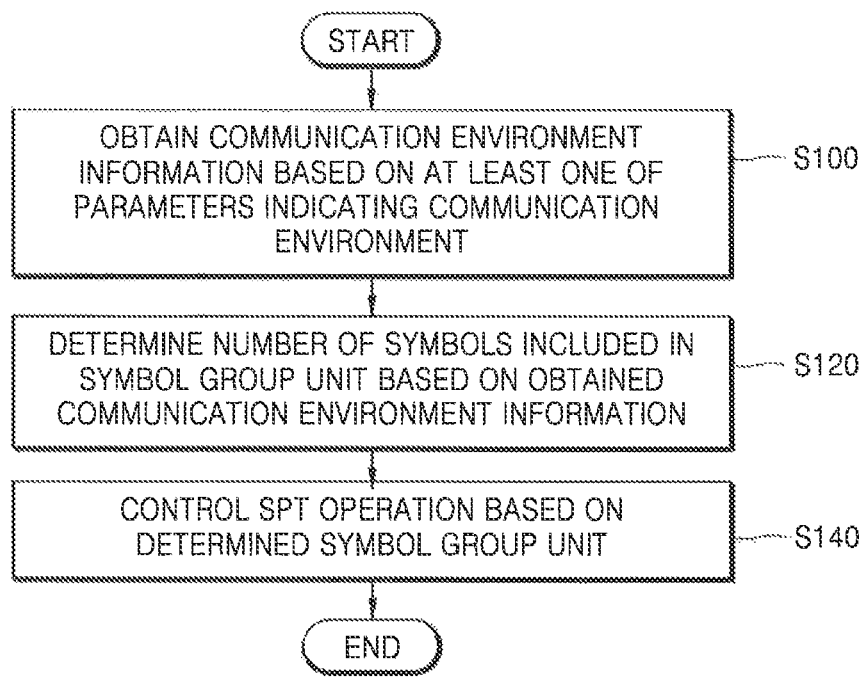
FIG. 10 is a flowchart of a method of determining a symbol group unit based on communication environments, according to an exemplary embodiment of the inventive concept.

FIG. 9 is a diagram of a 5G-based frame structure, which can be used to illustrate a method of determining a symbol group unit based on the 5G-based frame structure. FIG. 10 is a flowchart of a method of determining a symbol group unit based on communication environments, according to an exemplary embodiment of the inventive concept.

Referring to FIG. 9 one subframe (or a radio frame) may include a plurality of slots. For example, one subframe may include 10 slots (0-9). One slot may include a plurality of symbols. For example, one slot may include seven symbols. For example, slot 0 may include seven symbols 0-6. However, the inventive concept is not limited thereto. For example, one slot may include a different number of symbols according to a unit interval between sub-carriers for 5G wireless communication, in other words, a sub-carrier spacing size. In addition, at least one symbol included in one slot may be divided into mini-slots, and a mini-slot may be one unit for 5G-based low latency communications. A mini-slot may include two symbols 0 and 1 as shown in FIG. 8, for example. The baseband processor 112 of FIG. 8 may determine (or change) a symbol group unit according to the number of symbols included in the mini-slot.

Referring to FIG. 10, the baseband processor 112 of FIG. 8 may obtain communication environment information based on at least one of parameters indicating a communication environment (S100). In an exemplary embodiment of the inventive concept, the parameters indicating the communication environment may indicate a channel state between a base station and a wireless communication device. For example, the parameters indicating the communication environment may be associated with a channel quality indicator. Furthermore, the baseband processor 112 may obtain communication environment information based on system information and control information received from the base station. The baseband processor 112 may determine (or change) the number of symbols included in the symbol group unit based on the obtained communication environment information (S120). The baseband processor 112 may control an SPT modulation operation based on the determined symbol group unit (S140).

Figure 11:
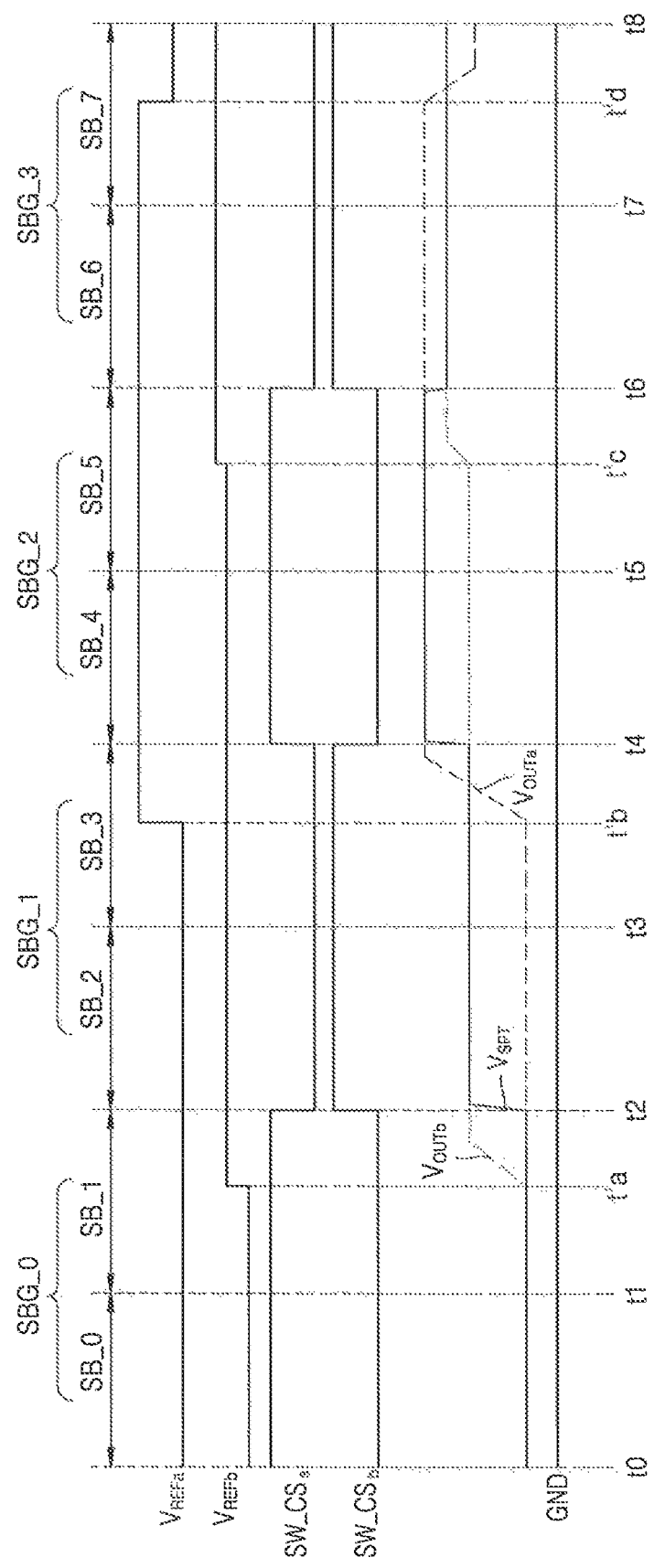
FIG. 11 is a diagram of signals for the symbol tracking modulator of FIG. 5 to perform operations.

FIG. 11 is a flowchart of signals for the symbol tracking modulator 300 of FIG. 5 to perform operations. Unlike in FIG. 6, it is assumed in FIG. 11 that a symbol group unit includes two symbols. For example, a first symbol group section SBG_0 includes symbols SB_0 and SB_1, a second symbol group section SBG_1 includes symbols SB_2 and SB_3, a third symbol group section SBG_2 includes symbols SB_4 and SB_5, and a fourth symbol group section SBG_3 includes symbols SB_6 and SB_7.

Referring to FIGS. 5 and 11, in the first symbol group section SBG_0 (a section between a time point 't0' and a time point 't2'), the SPT control circuit 310 may provide a first reference voltage $V_{REFa}$, which is maintained at a constant level based on a symbol tracking signal TS_SPT, to the first DC-DC converter 320, provide a first switching control signal $SW\_CS_a$ having a high level to the first switch element $SW_a$ based on a trigger signal Trigger_SPT that is received at the time point 't0,' and provide a first supply voltage $V_{OUTa}$ generated by the first DC-DC converter 320 as a selection supply voltage $V_{SPT}$ to the power amplifier PA. In the first symbol group section SBG_0, the SPT control circuit 310 may provide a second reference voltage $V_{REFb}$ of which a level is changed at a time point 't'a' to the second DC-DC converter 330 based on the symbol tracking signal TS_SPT, provide a second switching control signal $SW\_CS_b$ having a low level to the second switch element $SW_b$ based on the trigger signal Trigger_SPT that is received at the time point 't0,' and change a level of a second supply voltage $V_{OUTb}$ generated by the second DC-DC converter 330. For example, a level of the second supply voltage $V_{OUTb}$ may be increased.

In the second symbol group section SBG_1 (a section between the time point 't2' and a time point 't4'), the SPT control circuit 310 may provide a second reference voltage $V_{REFb}$, which is maintained at a constant level, to the second DC-DC converter 330 based on the symbol tracking signal TS_SPT, provide a second switching control signal $SW\_CS_b$ having a high level to the second switch element $SW_b$ based on a trigger signal Trigger_SPT that is received at the time point 't2,' and provide a second supply voltage $V_{OUTb}$ generated by the second DC-DC converter 330 as a selection supply voltage $V_{SPT}$ to the power amplifier PA. In the second symbol group section SBG_1, the SPT control circuit 310 may provide a first reference voltage $V_{REFa}$ of which a level is changed at a time point 't'b' to the first DC-DC converter 320 based on the symbol tracking signal TS_SPT, provide a first switching control signal $SW\_CS_a$ having a low level to the first switch element $SW_a$ based on the trigger signal Trigger_SPT that is received at the time point 't2,' and change a level of the first supply voltage $V_{OUTa}$ generated by the first DC-DC converter 320. For example, a level of the first supply voltage $V_{OUTa}$ may be increased.

Since the third symbol group section SBG_2, which may happen between time points 't4', 't5' and 't6' and include time point 't'c', and the fourth symbol group section SBG_3, which may happen between time points 't6', 't7' and 't8' and include time point 't'd', are about the same as described above for the third and fourth symbol sections SB_2 and SB_3 of FIG. 6, a description thereof will be mostly omitted.

As shown in FIG. 11, in the third symbol group section SBG_2, the SPT control circuit 310 may provide a second reference voltage $V_{REFb}$ of which a level is changed at a time point 't'c' to the second DC-DC converter 330 based on the symbol tracking signal TS_SPT, provide a second switching control signal $SW\_CS_b$ having a low level to the second switch element $SW_b$, and change a level of a second supply voltage $V_{OUTb}$ generated by the second DC-DC converter 330. In the fourth symbol group section SBG_3, the SPT control circuit 310 may provide a first reference voltage $V_{REFa}$ of which a level is changed at a time point 't'd' to the first DC-DC converter 320 based on the symbol tracking signal TS_SPT, provide a first switching control signal $SW\_CS_a$ having a low level to the first switch element $SW_a$, and change a level of a first supply voltage $V_{OUTa}$ generated by the first DC-DC converter 320.

Figure 12:
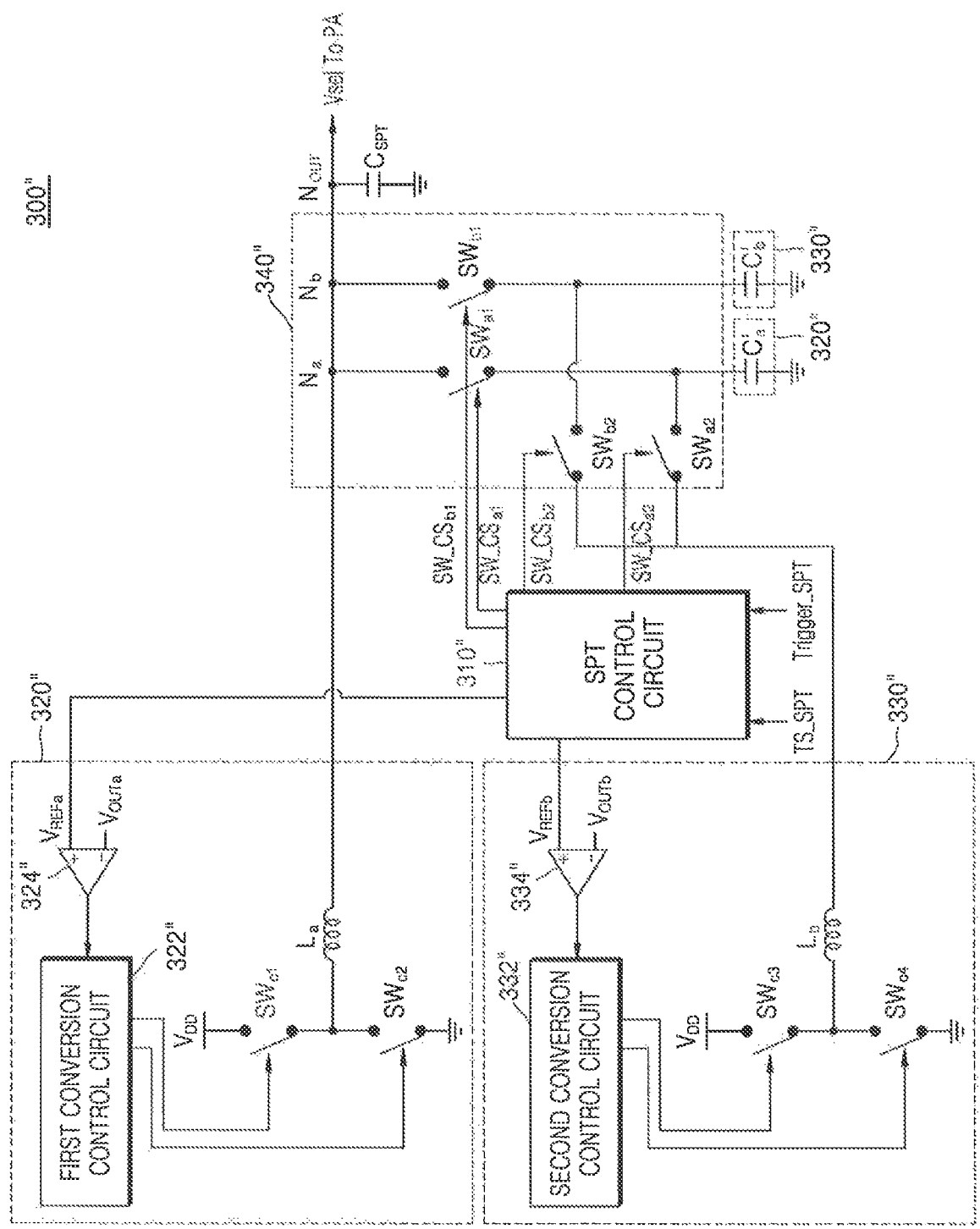
FIG. 12 is a circuit diagram of a symbol tracking modulator according to an exemplary embodiment of the inventive concept.

FIG. 12 is a circuit diagram of a symbol tracking modulator 300" according to an exemplary embodiment of the inventive concept.

Referring to FIG. 12, the symbol tracking modulator 300" may include an SPT control circuit 310", a first DC-DC converter 320", a second DC-DC converter 330", a switch circuit 340", and an output capacitor element $C_{SPT}$. The first DC-DC converter 320" and the second DC-DC converter 330" may support a dynamic voltage scaling (DVS) function. The first DC-DC converter 320" may include a first conversion control circuit 322", a first comparator 324", a plurality of switch elements (e.g., $SW_{c1}$ and $SW_{c2}$), an inductor element $L_a$, and a capacitor element $C''_a$. The second DC-DC converter 330" may include a second conversion control circuit 332", a second comparator 334", a plurality of switch elements (e.g., $SW_{c3}$ and $SW_{c4}$), an inductor element $L_b$, and a capacitor element $C''_b$. The switch circuit 340" may include a plurality of switch elements (e.g., $SW_{a1}$, $SW_{a2}$, $SW_{b1}$ and $SW_{b2}$).

The switch circuit 340" of FIG. 12 may have a different connection configuration from that of the switch circuit 340 of FIG. 5. In an exemplary embodiment of the inventive concept, a first switch element $SW_{a1}$ and a second switch element $SW_{a2}$ may be connected in series to each other, and a third switch element $SW_{b1}$ and a fourth switch element $SW_{b2}$ may be connected in series to each other. In addition, the first switch element $SW_{a1}$ and the second switch element $SW_{a2}$ may be connected in parallel to the third switch element $SW_{b1}$ and the fourth switch element $SW_{b2}$. The SPT control circuit 310" may generate a plurality of switching control signals $SW\_CS_{a1}$, $SW\_CS_{a2}$, $SW\_CS_{b1}$, and $SW\_CS_{b2}$ based on a trigger signal Trigger_SPT and provide the plurality of switching control signals $SW\_CS_{a1}$, $SW\_CS_{a2}$, $SW\_CS_{b1}$, and $SW\_CS_{b2}$ to the switch circuit 340". Since an operation of the symbol tracking modulator 300" is similar to that described above with reference to FIG. 5, a description thereof will be omitted.

Figure 13:
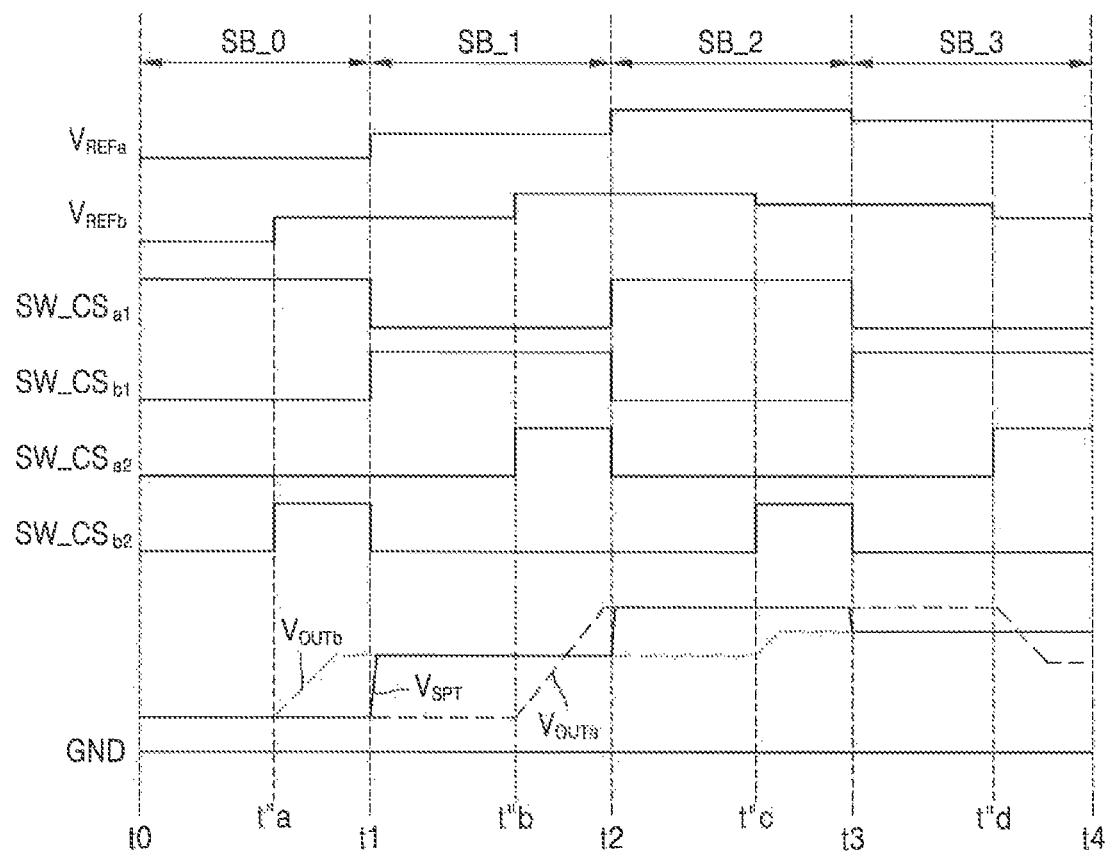
FIG. 13 is a diagram of signals for the symbol tracking modulator of FIG. 11 to perform operations.

FIG. 13 is a flowchart of signals for the symbol tracking modulator 300" of FIG. 12 to perform operations. Hereinafter, it will be assumed that a symbol group unit includes only one symbol.

Referring to FIGS. 12 and 13, in a first symbol section SB_0 (a section between a time point 't0' and a time point 't1'), the SPT control circuit 310" may provide a first reference voltage $V_{REFa}$, which is maintained at a constant level, to the first DC-DC converter 320" based on a symbol tracking signal TS_SPT, provide a first switching control signal $SW\_CS_{a1}$ having a high level to the first switch element $SW_{a1}$ based on a trigger signal Trigger_SPT that is received at the time point 't0,' provide a second switching control signal $SW\_CS_{a2}$ having a low level to the second switch element $SW_{a2}$, and provide a first supply voltage $V_{OUTa}$ generated by the first DC-DC converter 320" as a selection supply voltage $V_{SPT}$ to the power amplifier PA. In the first symbol section SB_0, the SPT control circuit 310" may provide a second reference voltage $V_{REFb}$ of which a level is changed at a time point 't"a' to the second DC-DC converter 330" based on the symbol tracking signal TS_SPT, provide a third switching control signal $SW\_CS_{b1}$ having a low level to the third switch element $SW_{b1}$ based on the trigger signal Trigger_SPT that is received at the time point 't0,' provide a fourth switching control signal $SW\_CS_{b2}$, which is changed from a low level to a high level at the time point 't"a,' to the fourth switch element $SW_{b2}$, and change a level of a second supply voltage $V_{OUTb}$ generated by the second DC-DC converter 330". For example, a level of the second supply voltage $V_{OUTb}$ may be increased.

In a second symbol section SB_1 (a section between the time point 't1' and a time point 't2'), the SPT control circuit 310" may provide a first reference voltage $V_{REFa}$ of which a level is changed at the time point 't1' to the first DC-DC converter 320" based on the symbol tracking signal TS_SPT, provide a first switching control signal $SW\_CS_{a1}$ having a low level to the first switch element $SW_{a1}$ based on a trigger signal Trigger_SPT that is received at the time point 't1,' provide a second switching control signal $SW\_CS_{a2}$, which is changed from a low level to a high level at a time point 't"b,' to the second switch element $SW_{a2}$, and change a level of a first supply voltage $V_{OUTa}$ generated by the first DC-DC converter 320". For example, a level of the first supply voltage $V_{OUTa}$ may be increased. In the second symbol section SB_1, the SPT control circuit 310" may provide a second reference voltage $V_{REFb}$ of which a level is changed at the time point 't"b' to the second DC-DC converter 330" based on the symbol tracking signal TS_SPT, provide a third switching control signal $SW\_CS_{b1}$ having a high level to the third switch element $SW_{b1}$ based on the trigger signal Trigger_SPT that is received at the time point 't1,' provide a fourth switching control signal $SW\_CS_{b2}$ having a low level to the fourth switch element $SW_{b2}$, and provide a second supply voltage $V_{OUTb}$ generated by the second DC-DC converter 330" as a selection supply voltage $V_{SPT}$ to the power amplifier PA.

Since a third symbol section SB_2 and a fourth symbol section SB_3 are about the same as described above for the third and fourth symbol sections SB_2 and SB_3 of FIG. 6, a description thereof will be mostly omitted.

As shown in FIG. 13, in the third symbol section SB_2, the SPT control circuit 310" may provide a second reference voltage $V_{REFb}$ of which a level is changed at a time point 't"c' to the second DC-DC converter 330". In the fourth symbol section SB_3, the SPT control circuit 310' may provide a second reference voltage $V_{REFb}$ of which a level is changed at a time point 't"d' to the second DC-DC converter 330'.

Figure 14:
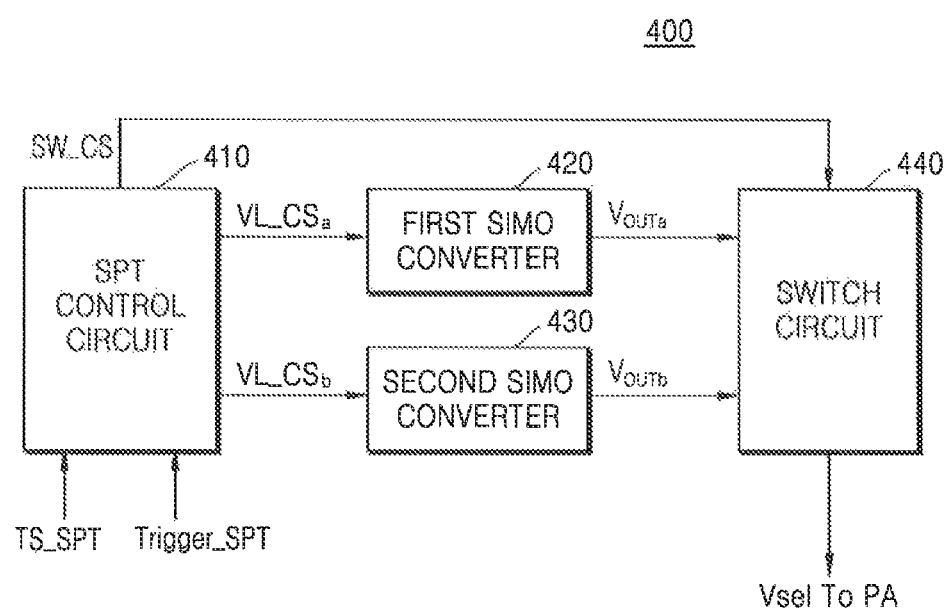
FIG. 14 is a block diagram of a symbol tracking modulator according to an exemplary embodiment of the inventive concept.
Figure 15:
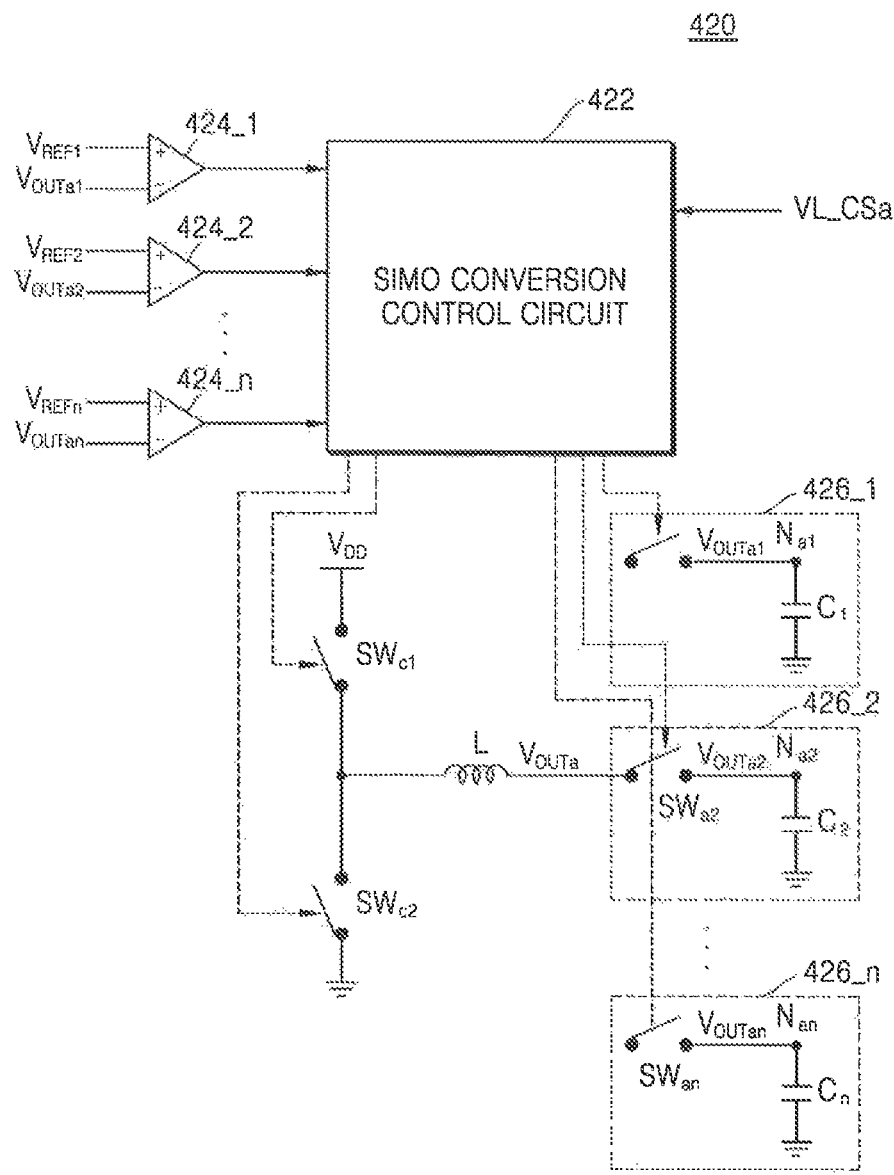
FIG. 15 is a circuit diagram of a first single-inductor multiple-output (SIMO) converter of FIG. 14.

FIG. 14 is a block diagram of a symbol tracking modulator 400 according to an exemplary embodiment of the inventive concept, and FIG. 15 is a circuit diagram of a first single-inductor multiple-output (SIMO) converter of FIG. 14.

Referring to FIG. 14, the symbol tracking modulator 400 may include an SPT control circuit 410, a first SIMO converter 420, a second SIMO converter 430, and a switch circuit 440. Referring to FIG. 15, the first SIMO converter 420 may include an SIMO conversion control circuit 422, a plurality of comparators 424_1 to 424_n, a plurality of voltage generation circuits 426_1 to 426_n, an inductor L, and switch elements $SW_{c1}$ and $SW_{c2}$. The first SIMO converter 420 may generate a plurality of voltages having different levels and output the plurality of voltages through respective output nodes $N_{a1}$ to $N_{an}$ of the voltage generation circuits 426_1 to 426_n.

The voltage generation circuits 426_1 to 426_n may include switch elements $SW_{a1}$ to $SW_{an}$ and capacitors $C_1$ to $C_n$, respectively. In an exemplary embodiment of the inventive concept, the voltage generation circuits 426_1 to 426_n may include capacitors having different capacitances and different loads, respectively. The comparators 424_1 to 424_n may receive reference voltages $V_{REF1}$ to $V_{REFn}$, respectively, and receive feedback signals $V_{OUTa1}$ to $V_{OUTan}$ from output nodes $N_{a1}$ to $N_{an}$ of the voltage generation circuits 426_1 to 426_n, respectively, generate control signals, and provide the control signals to the SIMO conversion control circuit 422.

In an exemplary embodiment of the inventive concept, the SIMO conversion control circuit 422 may generate switching control signals for controlling on/off operations of the switch elements $SW_{a1}$ to $SW_{an}$ based on a first voltage-level control signal $VL\_CS_a$, provide the switching control signals to the switch elements $SW_{a1}$ to $SW_{an}$, and change a level of a first supply voltage $V_{OUTa}$ generated by the first SIMO converter 420. In other words, an SPT modulation operation according to an exemplary embodiment of the inventive concept may be performed using the first SIMO converter 420 that does not support a DVS function.

Referring back to FIG. 14, the SPT control circuit 410 may generate a switching control signal SW_CS based on a trigger signal Trigger_SPT, provide the switching control signal SW_CS to the switch circuit 440, and alternately select the first supply voltage $V_{OUTa}$ of the first SIMO converter 420 and a second supply voltage $V_{OUTb}$ of the second SIMO converter 430. Other operations of the symbol tracking modulator 420 have been described in detail with reference to FIG. 4A, and thus, a description thereof will be omitted.

Figure 16:
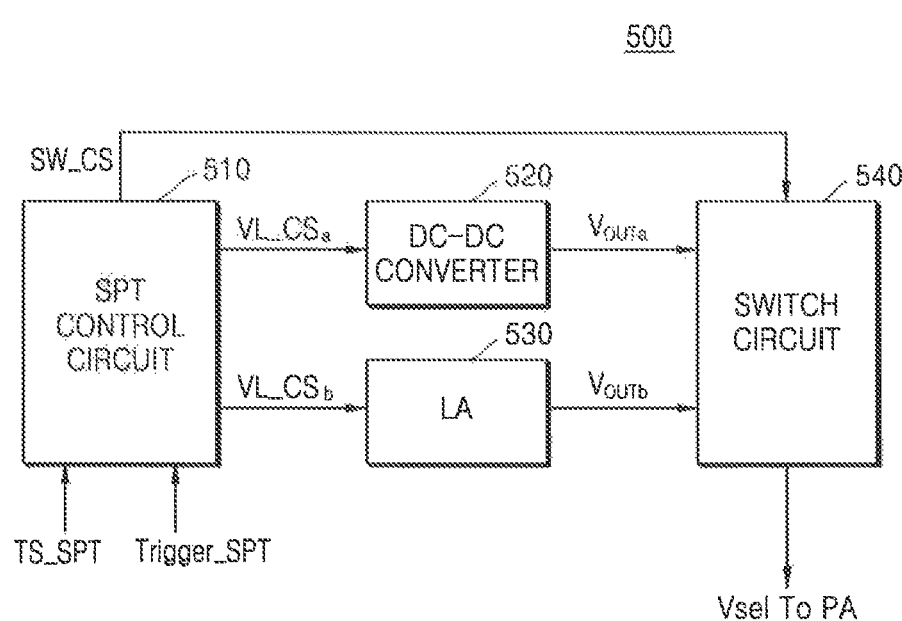
FIGS. 16 and 17 are block diagrams of symbol tracking modulators according to exemplary embodiments of the inventive concept.
Figure 17:
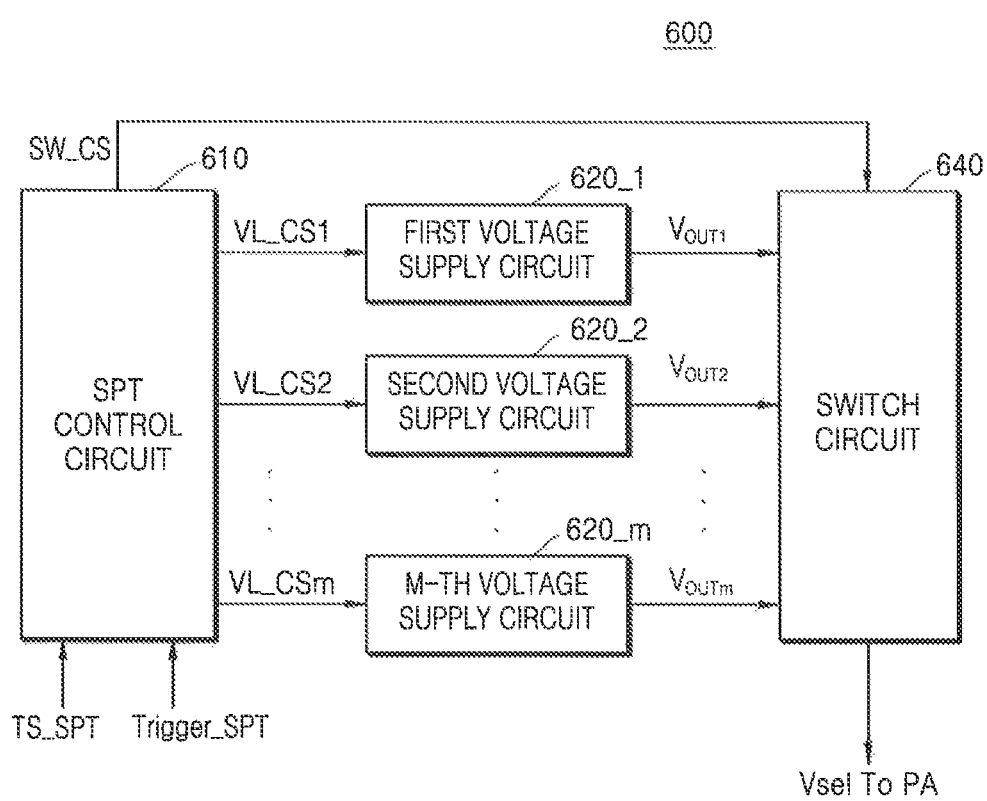

FIGS. 16 and 17 are block diagrams of symbol tracking modulators according to exemplary embodiments of the inventive concept.

Referring to FIG. 16, a symbol tracking modulator 500 may include an SPT control circuit 510, a DC-DC converter 520, a linear amplifier 530, and a switch circuit 540. In other words, the first and second voltage supply circuits 220 and 230 of FIG. 4A may be implemented as different kinds of circuits, and any one of the first and second voltage supply circuits 220 and 230 may be implemented as the linear amplifier 530.

Referring to FIG. 17, a symbol tracking modulator 600 may include a larger number of voltage supply circuits 620_1 to 620_m than the symbol tracking modulator 200 of FIG. 4A. An SPT control circuit 610 may sequentially select supply voltages $V_{OUT1}$ to $V_{OUTm}$ generated by the voltage supply circuits 620_1 to 620_m as a selection supply voltage Vsel based on a trigger signal Trigger_SPT, and change levels of unselected supply voltages based on a symbol tracking signal TS_SPT. The supply voltages $V_{OUT1}$ to $V_{OUTm}$ may be provided to switch circuit 640. The SPT control circuit 610 may output voltage-level control signals VL_CS1 to VL_CSm.

Since operations of the symbol tracking modulators 500 and 600 correspond to the symbol tracking modulator 400 described in detail with reference to FIG. 4A, a description thereof will be omitted.

Figure 18:
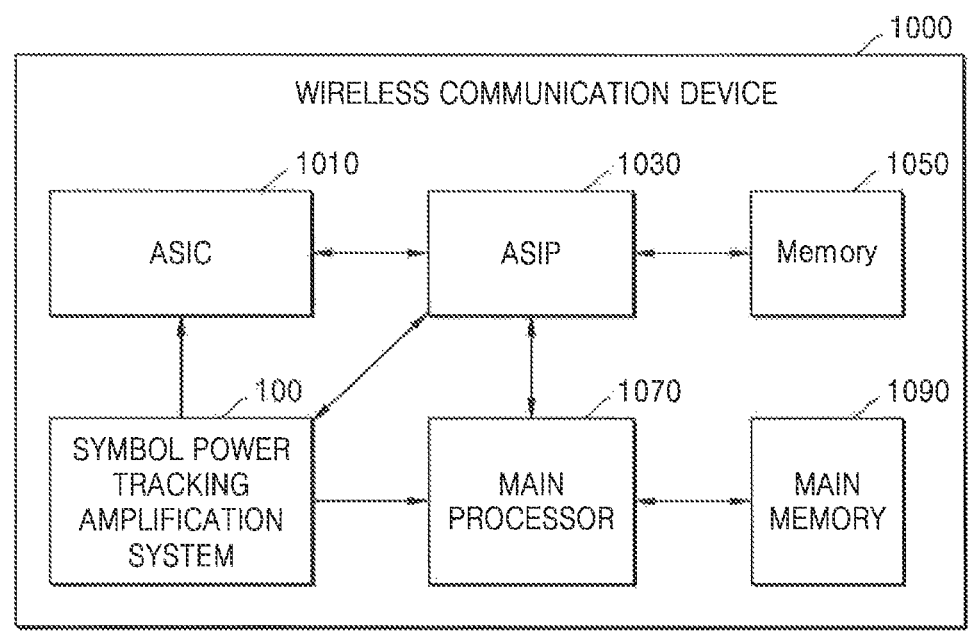
FIG. 18 is a block diagram of a wireless communication device according to an exemplary embodiment of the inventive concept.

FIG. 18 is a block diagram of a wireless communication device 1000 according to an exemplary embodiment of the inventive concept.

Referring to FIG. 18, the wireless communication device 1000, which is an example of a communication device, may include a symbol power tracking amplification system (100), an application specific integrated circuit (ASIC) 1010, an application specific instruction set processor (ASIP) 1030, a memory 1050, a main processor 1070, and a main memory 1090. The symbol power tracking amplification system (100) can support the symbol power tracking modulation technique by applying the embodiments described in the figures above. At least two of the ASIC 1010, the ASIP 1030, and the main processor 1070 may communicate with each other. In addition, at least two of the ASIC 1010, the ASIP 1030, the memory 1050, the main processor 1070, and the main memory 1090 may be embedded in a single chip.

The ASIP 1030, which is a customized IC for a specific purpose, may support a dedicated instruction set for a specific application and execute instructions included in the instruction set. The memory 1050 may communicate with the ASIP 1030 and serve as a non-transitory storage device to store a plurality of instructions executed by the ASIP 1030. In some embodiments of the inventive concept, the memory 1050 may store the SPT control module 114 of FIG. 7. The memory 1050 may include, but is not limited thereto, an arbitrary type of memory accessible by the ASIP 1030, for example, a random access memory (RAM), a read-only memory (ROM), a tape, a magnetic disc, an optical disc, a volatile memory, a non-volatile memory, and/or a combination thereof. The ASIP 1030 or the main processor 1070 may execute a series of instructions stored in the memory 1050 and control an SPT modulation operation.

The main processor 1070 may execute a plurality of instructions and control the wireless communication device 1000. For example, the main processor 1070 may control the ASIC 1010 and the ASIP 1030, process data received through a wireless communication network, or process a user's input for the wireless communication device 1000. The main memory 1090 may communicate with the main processor 1070 and serve as a non-transitory storage device to store the plurality of instructions executed by the main processor 1070.

Figure 19:
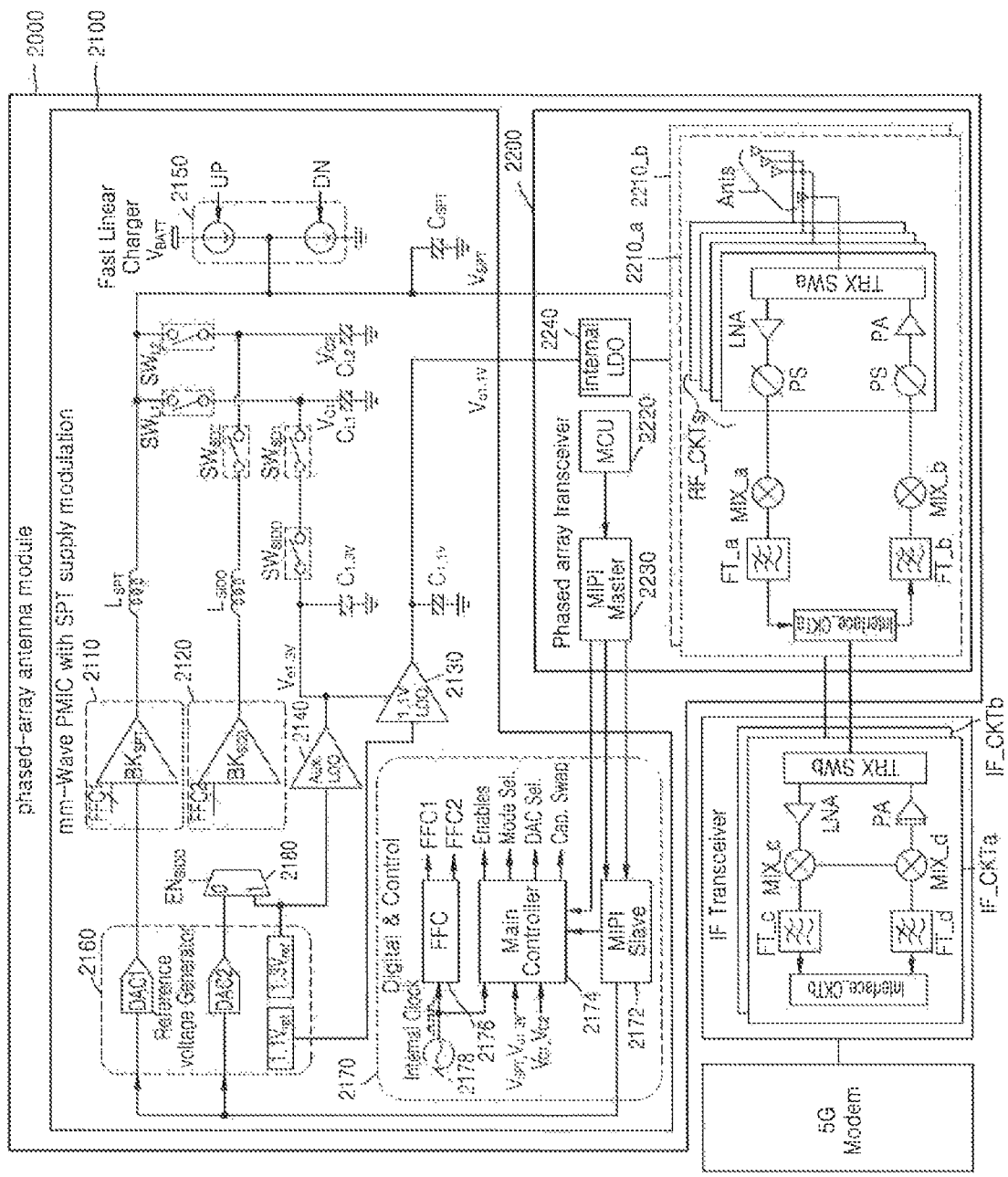
FIG. 19 is a block diagram of a phased array antenna module according to an exemplary embodiment of the inventive concept.

FIG. 19 is a block diagram of a phased array antenna module 2000 according to an exemplary embodiment of the inventive concept. Hereinafter, an embodiment in which the phased array antenna module 2000 performs a symbol power tracking (SPT) modulation operation suitable for fifth-generation (5G) communication will be described. It is to be understood, however, that the inventive concept is not limited thereto and may be applied to other power tracking schemes.

Referring to FIG. 19, the phased array antenna module 2000 may include a power management integrated circuit (PMIC) 2100 and a phased array transceiver 2200. The PMIC 2100 may be an mm-wave PMIC with SPT supply modulation. The PMIC 2100 may include two direct current-direct current (DC-DC) converters (hereinafter, referred to as buck converters) 2110 and 2120, a 1.1V linear drop-out (LDO) linear regulator 2130, a subsidiary (or auxiliary) LDO 2140, a fast charge/discharge current source 2150, a reference voltage generator 2160, a controller 2170, a multiplexer 2180, a plurality of capacitors $C_{1.1V}$, $C_{1.3V}$, $C_{L1}$, and $C_{L2}$, a plurality of SPT switches $SW_{L1}$, $SW_{L2}$, $SW_{SD1}$, and $SW_{SD2}$, and a single-inductor dual-output (SIDO) switch $SW_{SIDO}$. The first buck converter 2110 may be used to perform operations of the first voltage supply circuit 220 and the second voltage supply circuit 230 of FIG. 4A. The second buck converter 2120 may be used to precharge or pre-discharge load capacitors $C_{L1}$ and $C_{L2}$ in accordance with a time point of an SPT operation. In addition, the SPT switches $SW_{L1}$, $SW_{L2}$, $SW_{SD1}$, and $SW_{SD2}$ may also be used to provide a supply voltage $V_{SPT}$ corresponding to the SPT operation to the phased array transceiver 2200. The first buck converter 2110 may be connected to an SPT inductor $L_{SPT}$, and the second buck converter 2120 may be connected to a SIDO inductor $L_{SIDO}$.

The controller 2170 may include a mobile industry processor interface (MIPI) slave 2172, a main controller 2174, a Fixed Frequency Controller (FFC) 2176, and an internal clock source 2178. The phased array transceiver 2200 may include two transceiving circuits 2210_a and 2210_b, a microcontroller unit (MCU) 2220, an MIPI master 2230, and an internal LDO 2240. The transceiving circuits 2210_a and 2210_b may include a plurality of antennas Ants, a plurality of radio-frequency (RF) circuits RF_CKTs, mixers MIX_a and MIX_b, and an interface circuit Interface_CKTa. Each of the RF circuits RF_CKTs may include a transceiver switch TRX SWa, a low-noise amplifier LNA, a power amplifier PA and a plurality of phase shifters PS. The transceiving circuits 2210_a and 2210_b may further include a plurality of filters FT_a and FT_b. The transceiving circuits 2210_a and 2210_b may be connected to intermediate frequency (IF) circuits IF_CKT_a and IF_CKT_b of an IF transceiver. The transceiving circuits 2210_a and 2210_b may receive an RF signal through the antennas Ants, down-convert the RF signal into an IF signal, and provide the IF signal to the IF transceiver.

Each of the IF circuits IF_CKT_a and IF_CKT_b may include a transceiver switch TRX SWb, a low-noise amplifier LNA, a power amplifier PA, a plurality of mixers MIX_c and MIX_d, a plurality of filters FT_c and FT_d, and an interface circuit Interface_CKT. Each of the IF circuits IF_CKT_a and IF_CKT_b may down-convert a received IF signal into a baseband signal and provide the baseband signal to a 5G modem.

After a power-on-reset signal is generated by an external digital supply, a digital communication channel caused by a MIPI between the PMIC 2100 and the phased array transceiver 2200 may be ready. In other words, a digital communication channel between the MIPI master 2230 and the MIPI slave 2172 may be ready.

The MCU 2220 may generate a timing signal Tick (or a trigger signal) at every cyclic prefix (CP) start time to precisely synchronize with a transmission power update time point and an SPT transition time point. In addition, the MCU 2220 may provide data DATA, a clock signal CLK, and a timing signal Tick required for an SPT operation of the PMIC 2100 through the MIPI master 2230 to the MIPI slave 2172 and the main controller 2174 of the controller 2170.

The MIPI slave 2172 may receive the data DATA and the clock signal CLK, generate a signal based on the data DATA and the clock signal CLK and provide the generated signal to the reference voltage generator 2160. For example, the MIPI slave 2172 may provide power level signals $PWL_1$ and $PWL_2$ to the first and second buck converters 2110 and 2120, respectively. The reference voltage generator 2160 may include a first digital-to-analog converter (DAC) DAC1, which is connected to the first buck converter 2110, and a second DAC DAC2, which is selectively connected to any one of the second buck converter 2120 and the subsidiary LDO 2140 through the multiplexer 2180. The reference voltage generator 2160 may include components to generate a first reference voltage of $1.1V_{ref}$ and a second reference voltage of $1.3V_{ref}$.

The main controller 2174 may receive an internal clock signal from the internal clock source 2178, and supply voltages $V_{SPT}$ and $V_{o1.3V}$ and load capacitor voltages $V_{C1}$ and $V_{C2}$ may be fed back into the main controller 2174. The main controller 2174 may generate enable signals Enables for the fast charge/discharge current source 2150, a mode selection signal Mode Sel. for selecting a power tracking mode using the first and second buck converters 2110 and 2120, a DAC selection signal DAC Sel. of the reference voltage generator 2160, and a switch control signal Cap. Swap for a capacitor swapping operation, based on the received voltages $V_{SPT}$, $V_{o1.3V}$, $V_{C1}$, and $V_{C2}$ and the internal clock signal. The fast charge/discharge current source 2150 may be provided with UP and DN signals. The fast charge/discharge current source 2150 may be connected between a $V_{BATT}$ node through which a battery voltage is applied and a ground node through which a ground voltage is applied. The multiplexer 2180 may be provided with an enable signal $EN_{SIDO}$.

In addition, the FFC 2176 may control the frequencies of the first and second buck converters 2110, 2120 to be constant. In other words, when operating in the hysteretic control mode, the first and second buck converters 2110, 2120 are not synchronized to the reference clock, and thus, the frequencies can be changed according to PVT changes and an operating condition. To prevent such changes in frequency, the FFC 2176 may provide the first Fixed Frequency Control (FFC) signal FFC1 and the second FFC signal FFC2 generated based on the internal clock signal to the first and second buck converters 2110, 2120, respectively.

To perform an SPT operation according to an exemplary embodiment of the inventive concept, two control schemes related to a capacitor swapping operation between the load capacitors $C_{L1}$ and $C_{L2}$ and a fast charge/discharge operation on an output capacitor $C_{SPT}$ may be applied to the PMIC 2100. For example, the capacitor swapping operation may be an operation of controlling selective connection of a second buck converter 2120 ($BK_{SIDO}$) to the load capacitors $C_{L1}$ and $C_{L2}$ so that the load capacitors $C_{L1}$ and $C_{L2}$ may be precharged or pre-discharged in the SPT operation according to the present embodiment of the inventive concept. In addition, the fast charge/discharge operation may be performed using the fast charge/discharge current source 2150. Since the fast charge/discharge operation is described with reference to FIGS. 7A and 7B, a detailed description thereof will be omitted.

Since the phased array transceiver 2200 may consume a large supply current at 1.1V, the second buck converter 2120 may implement 1.3V DC-DC buck conversion to enable efficient sub-regulation of the 1.1V LDO 2130 using an SIDO operation. $V_{o1.3V}$ may be a voltage output from subsidiary LDO 2140 and Vo1.1V may be a voltage output from 1.1V LDO 2130.

Figure 20A:
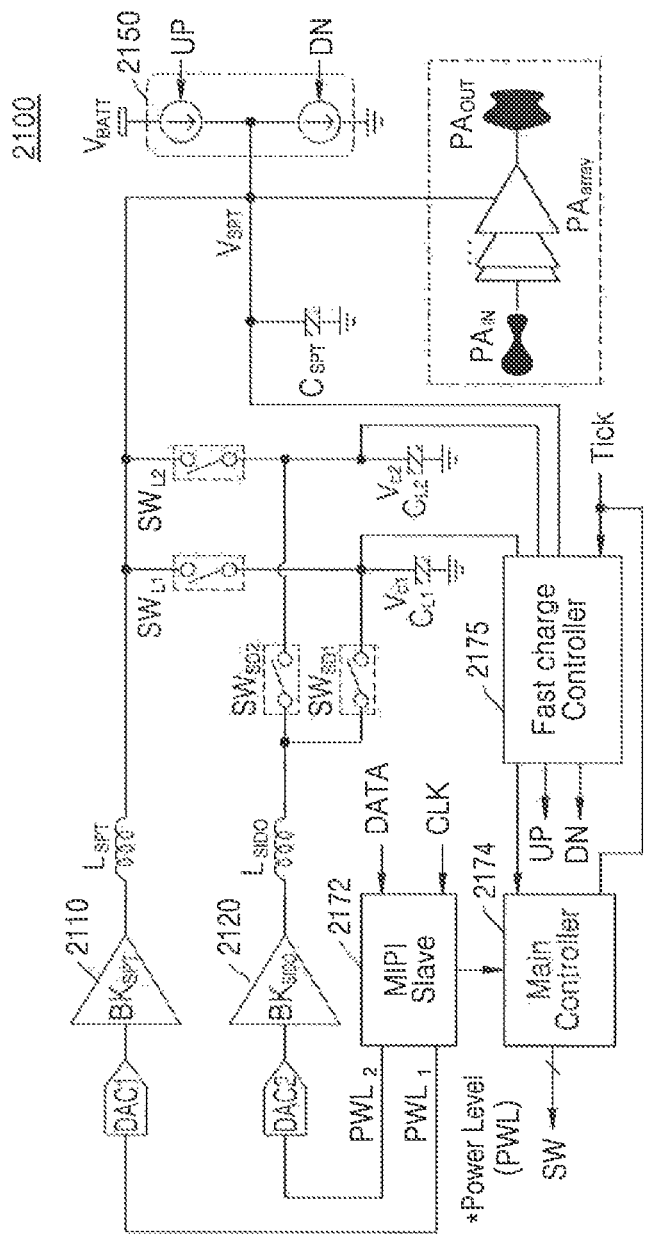
FIGS. 20A and 20B are diagrams illustrating an SPT operation using a single-inductor dual-output (SIDO) according to an exemplary embodiment of the inventive concept.
Figure 20B:
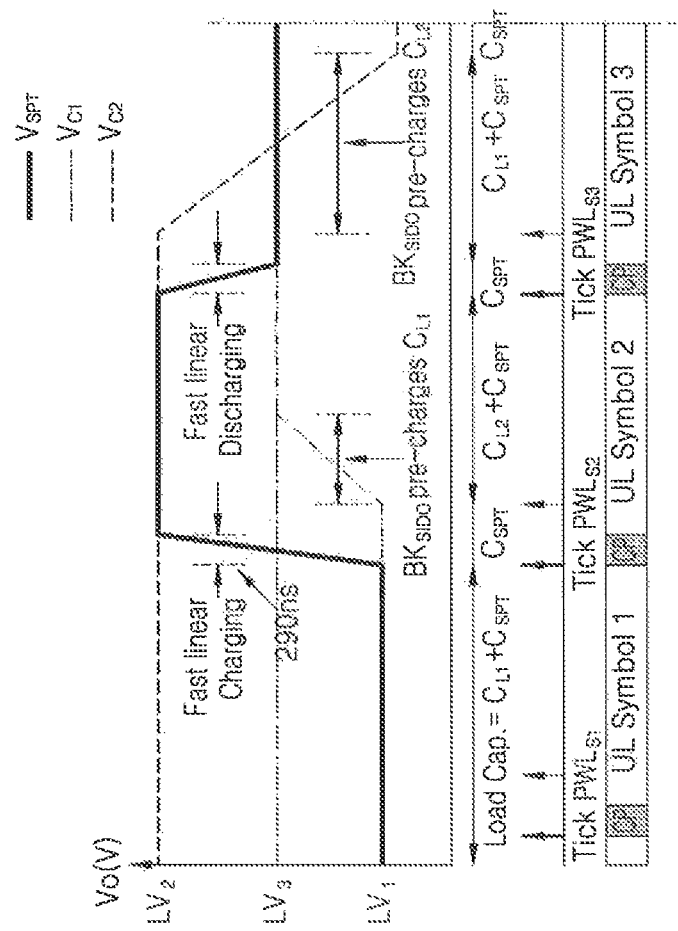

FIGS. 20A and 20B are diagrams illustrating an SPT operation using an SIDO according to an exemplary embodiment of the inventive concept. Since a configuration of a PMIC 2100 of FIG. 20A is the same as that described with reference to FIG. 19, a repeated description thereof will be omitted.

Referring to FIG. 20A, to enable an SPT operation, a first buck converter 2110 may receive two data from a fifth-generation (5G) modem. One data may be data about a power level of a next symbol, and another data may be data about a CP start time. A second buck converter 2120 may precharge or pre-discharge first and second load capacitors $C_{L1}$ and $C_{L2}$ based on power level data within a predetermined current symbol duration of, for example, 4.16 μs. When the first buck converter 2110 performs the SPT operation and the second buck converter 2120 performs a precharge operation, instead of a power source for a 1.3V supply voltage, a subsidiary LDO (refer to 2140 in FIG. 19) may start smoothly regulating a 1.3V voltage in a feedback loop and supply current required to precharge or dis-precharge the first and second load capacitors $C_{L1}$ and $C_{L2}$. When the precharge operation on the first and second load capacitors $C_{L1}$ and $C_{L2}$ is completed, the second buck converter 2120 may regulate 1.3V DC output to enable sub-regulation of the 1.1V LDO (refer to 2130 in FIG. 19). The second buck converter 2120 may receive a CP start time signal, the first and second load capacitors $C_{L1}$ and $C_{L2}$ may be disconnected from a $V_{SPT}$ output, and a fast charge/discharge current source 2150 may rapidly charge or discharge an output capacitor $C_{SPT}$ under the control of a fast charge controller 2175. When a voltage difference between the output capacitor $C_{SPT}$ and the first load capacitor $C_{L1}$ or the second load capacitor $C_{L2}$ is within a threshold value, the fast charge controller 2175 may generate a swap trigger signal SWAP_EN, and the output capacitor $C_{SPT}$ may be connected to any one of the first load capacitor $C_{L1}$ and the second load capacitor $C_{L2}$ in response to the swap trigger signal SWAP_EN.

In the SPT operation according to the present embodiment of the inventive concept, the output capacitor $C_{SPT}$ may be rapidly charged or discharged, and the first and second load capacitors $C_{L1}$ and $C_{L2}$ may be precharged or pre-discharged by the second buck converter 2120. When the voltage difference between the output capacitor $C_{SPT}$ and the first load capacitor $C_{L1}$ or the second load capacitor $C_{L2}$ is the threshold value or less, a capacitor swapping operation may be performed between the $V_{SPT}$ output and the first and second load capacitors $C_{L1}$ and $C_{L2}$. Thus, transition ends may be ensured within a time duration of about 290 nm, and a high inrush current may be prevented.

Referring back to FIG. 20B, a first buck converter 2110 ($BK_{SPT}$) may connect a first load capacitor $C_{L1}$ having a voltage with a first level $LV_1$ to the $V_{SPT}$ output in a duration corresponding to a first uplink symbol UL Symbol 1 in response to a first trigger signal Tick. Thus, in the duration corresponding to the first uplink symbol UL Symbol 1, a supply voltage $V_{SPT}$ having the first level $LV_1$ may be provided to a power amplification (PA) array. The PA array may also receive a PA input signal $PA_{IN}$ and generate a PA output signal $PA_{OUT}$. In addition, the first buck converter 2110 ($BK_{SPT}$) may generate a second load capacitor voltage $V_{C2}$ having a second level $LV_2$ in response to a '$PWL_{S1}$' signal. In the duration corresponding to the first uplink symbol UL Symbol 1, an output load capacitance of a PMIC 2100 may be determined by the sum of a capacitance of the first load capacitor $C_{L1}$ and a capacitance of the output capacitor $C_{SPT}$.

In addition, in response to a second trigger signal Tick, the fast charge controller 2175 may control a fast linear charging operation on the output capacitor $C_{SPT}$ such that a level of the supply voltage $V_{SPT}$ is charged to the second level $LV_2$. For example, the fast charge controller 2175 may generate an UP signal or a DN signal. In a fast linear charging operation duration, the output load capacitance of the PMIC 2100 may be determined by the capacitance of the output capacitor $C_{SPT}$.

In response to the second trigger signal Tick, the main controller 2174 may connect the second load capacitor $C_{L2}$ having a voltage with the second level $LV_2$ to the $V_{SPT}$ output in a duration corresponding to a second uplink symbol UL Symbol 2 when a voltage difference between the output capacitor $C_{SPT}$ and the second load capacitor $C_{L2}$ is a threshold value or less. Thus, in the duration corresponding to the second uplink symbol UL Symbol 2, a supply voltage $V_{SPT}$ having a second level $L_{V2}$ may be provided to the PA array. In addition, the first buck converter 2110 ($BK_{SPT}$) may generate a first load capacitor voltage $V_{C1}$ having a third level $LV_3$ in response to a '$PWL_{S2}$' signal, and the second buck converter 2120 ($BK_{SIDO}$) may precharge the first load capacitor $C_{L1}$. In the duration corresponding to the second uplink symbol UL Symbol 2, the output load capacitance of the PMIC 2100 may be determined by the sum of a capacitance of the second load capacitor $C_{L2}$ and the capacitance of the output capacitor $C_{SPT}$.

In addition, in response to a third trigger signal Tick, the fast charge controller 2175 may control a fast linear discharging operation on the output capacitor $C_{SPT}$ such that a level of the supply voltage $V_{SPT}$ is discharged to the third level $LV_3$. In a fast linear discharging operation duration, the output load capacitance of the PMIC 2100 may be determined by the capacitance of the output capacitor $C_{SPT}$.

In response to the third trigger signal Tick, the main controller 2174 may connect the first load capacitor $C_{L1}$ having the voltage with the third level $LV_3$ to the $V_{SPT}$ output in a duration corresponding to a third uplink symbol UL Symbol 3 when a voltage difference between the output capacitor $C_{SPT}$ and the first load capacitor $C_{L1}$ is a threshold value or less. Thus, in the duration corresponding to the third uplink symbol UL Symbol 3, a supply voltage $V_{SPT}$ having the third level $L_{V3}$ may be provided to the PA array. In addition, the first buck converter 2110 ($BK_{SPT}$) may generate a second load capacitor voltage $V_{C2}$ having the first level $LV_1$ in response to a '$PWL_{S3}$' signal, and the second buck converter 2120 ($BK_{SIDO}$) may pre-charge the second load capacitor $C_{L2}$. In the duration corresponding to the third uplink symbol UL Symbol 3, the output load capacitance of the PMIC 2100 may be determined by the sum of the capacitance of the first load capacitor $C_{L1}$ and the capacitance of the output capacitor $C_{SPT}$.

Figure 21:
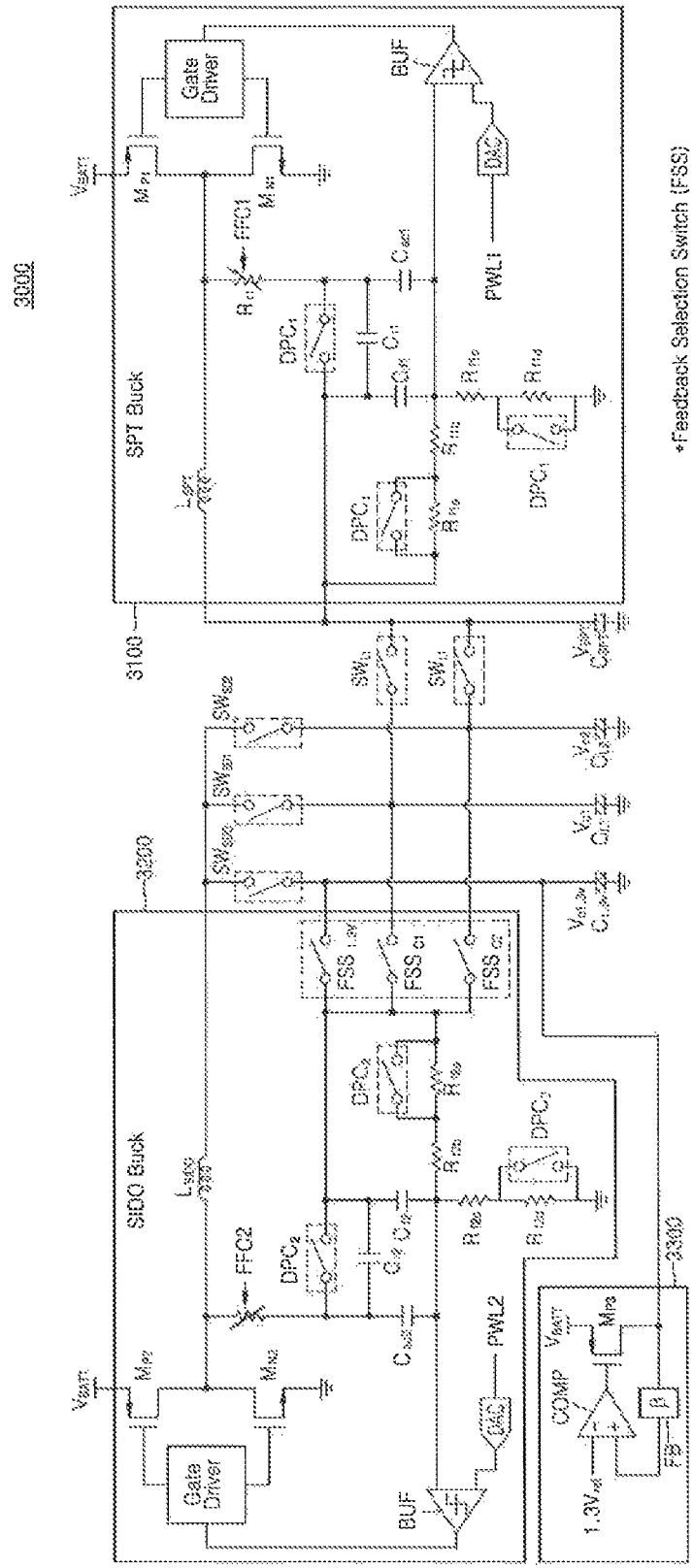
FIG. 21 is a block diagram of a power management integrated circuit (PMIC) including two buck converters configured to support a ripple-injected hysteresis control function, according to an exemplary embodiment of the inventive concept.

FIG. 21 is a block diagram of a PMIC 3000 including two buck converters (e.g., first and second buck converters 3100 and 3200) configured to support a ripple-injected hysteresis control function, according to an exemplary embodiment of the inventive concept.

Referring to FIG. 21, the PMIC 3000 may include a first buck converter 3100, a second buck converter 3200, a subsidiary LDO 3300, a plurality of switches $SW_{SIDO}$, $SW_{SD1}$, $SW_{SD2}$, $SW_{L1}$, and $SW_{L2}$, and a plurality of capacitors $C_{1.3V}$, $C_{L1}$, $C_{L2}$, and $C_{SPT}$. The first buck converter 3100 may include an $M_{P1}$ transistor, an $M_{N1}$ transistor, a gate driver, an SPT inductor $L_{SPT}$, a variable resistor $R_{c1}$, a plurality of resistors $R_{f1a}$, $R_{f1b}$, $R_{f1c}$, and $R_{f1d}$, a plurality of capacitors $C_{ac1}$, $C_{r1}$, and $C_{f1}$, a DAC, a buffer BUF, and switches $DPC_1$ for dynamic precharge control. The second buck converter 3200 may include an $M_{P2}$ transistor, an $M_{N2}$ transistor, a gate driver, a SIDO inductor $L_{SIDO}$, a variable resistor $R_{f2}$, a plurality of resistors $R_{f2a}$, $R_{f2b}$, $R_{f2c}$, and $R_{f2d}$, a plurality of capacitors $C_{ac2}$, $C_{r2}$, and $C_{f2}$, a DAC, a comparator BUF, switches $DPC_2$ for dynamic precharge control, and a plurality of feedback selection switches $FSS_{1.3V}$, $FSS_{C1}$, and $FSS_{C2}$ to be connected to load capacitors $C_{1.3V}$, $C_{L1}$, and $C_{L2}$. In addition, the subsidiary LDO 3300 may include a comparator COMP, a feedback block FB, and an $M_{P3}$ transistor. The comparator COMP may be input with a $1.3V_{ref}$. The capacitors $C_{1.3V}$, $C_{L1}$, $C_{L2}$, and $C_{SPT}$ may respectively receive the following voltages $V_{0.13V}$, $V_{c1}$, $V_{c2}$ and $V_{SPT}$.

As shown in FIG. 21, stability and smooth transition of a loop may be ensured using the configuration of the first and second buck converters 3100 and 3200. For example, if there is a sharply changed feedback input, target outputs of the first and second buck converters 3100 and 3200 may be stabilized. In other words, the first buck converter 3100 and the second buck converter 3200 may smoothly perform an SPT operation and an SIDO operation, respectively.

In the first buck converter 3100 and the second buck converter 3200 according to an exemplary embodiment of the inventive concept, a dynamic precharge control method may be applied to a hysteretic feedback loop through switches $DPC_1$ and $DPC_2$. A feed-forward path from output to internal compensation nodes may be directly formed only as long as an SPT or SIDO transition time. A loop response time may be shortened within a predetermined amount of time by using the above-described dynamic precharge control method. According to scenarios of the SPT operation and the SIDO operation, a reference voltage generator included in the first and second buck converters 3100 and 3200 may generate appropriate reference voltages to enable each buck regulation operation. The reference voltage generator may include two DACs, two buffers BUF, and a track & hold circuit.

A hysteretic controller may generate a variation in output switching frequency depending on a ratio of input to output. The variation in output switching frequency may be modulated into a PA transmission signal and represented by an unwanted spurious spectrum.

When there are variations in process, voltage, and temperature (PVT), a switching frequency controller may apply a simple frequency-locked loop to the hysteretic controller to ensure noise attenuation due to a selected inductor-capacitor (LC) filter.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A symbol tracking modulator for generating a supply voltage, comprising;
   a control circuit configured to generate a first reference voltage and a second reference voltage in response to a symbol tracking signal and a trigger signal, the symbol tracking signal corresponding to a plurality symbol groups based on a symbol group unit including at least one symbol and the trigger signal indicating a time point in which a new symbol group begins;
   a first voltage supply circuit configured to generate a first output voltage in response to the first reference voltage;
   a second voltage supply circuit configured to generate a second output voltage in response to the second reference voltage; and
   a switch circuit configured to alternately output one of the first output voltage and the second output voltage as the supply voltage for each symbol group section based on a switching control signal based on the trigger signal by the control circuit,
   wherein while the first output voltage is being output as the supply voltage in a first symbol group section, the second voltage supply circuit prepares the second output voltage to be output as the supply voltage in a second symbol group section which occurs after the first symbol group section.

2. The symbol tracking modulator of claim 1, further comprising an output terminal connected to an output of the switch circuit to provide the supply voltage to an external device.

3. The symbol tracking modulator of claim 2, wherein the each symbol group comprises at least one cyclic prefix and at least one real symbol, and a voltage transition in the supply voltage occurs within a cyclic prefix section.

4. The symbol tracking modulator of claim 2, wherein the symbol tracking signal is provided from one of a modem and a RFIC (Radio Frequency Integrated Circuit),
   wherein external device is a power amplifier configured to amplify an RF (Radio Frequency) signal from the RFIC,
   wherein the RF signal is derived from a baseband signal output from the modem.

5. The symbol tracking modulator of claim 2, wherein the first voltage supply circuit is a first DC-DC converter including an inductor element and a capacitor element to generate the first output voltage in response to the first reference voltage and drive the first output voltage to the output terminal through the switch circuit in response to a first switching control signal of the switching control signal during an odd symbol group section.

6. The symbol tracking modulator of claim 5, wherein the second voltage supply circuit is a second DC-DC converter including an inductor element and a capacitor element to generate the second output voltage in response to the second reference voltage and drive the second output voltage to the output terminal through the switch circuit in response to a second switching control signal of the switching control signal during an even symbol group section,
   wherein the odd symbol group section and the even symbol group section is successive.

7. The symbol tracking modulator of claim 2, wherein the output terminal is configured to be connected to a first current source and a second current source through a first fast charge control switch and a second fast charge control switch.

8. The symbol tracking modulator of claim 7, wherein the first current source is configured to charge the output terminal to be close to the first output voltage or the second output voltage before the switch circuit outputs one of the first output voltage and the second output voltage as the supply voltage.

9. The symbol tracking modulator of claim 7, wherein the second current source is configured to discharge the output terminal to be close to the first output voltage or the second output voltage before the switch circuit outputs one of the first output voltage and the second output voltage as the supply voltage.

10. The symbol tracking modulator of claim 1, wherein the symbol tracking signal is provided as digital signal,
wherein the control circuit includes at least two DACs (Digital to Analog Converters) to generate the first reference voltage and the second reference voltage, respectively.

11. The symbol tracking modulator of claim 1, wherein a first symbol group section in which transition of the first reference voltage occurs is different from a second symbol group section in which transition of the second reference voltage occurs.

12. A symbol power tracking amplification system for supporting symbol power tracking modulation, comprising:
a power amplifier configured to amplify a radio frequency (RF) signal; and
a symbol tracking modulator configured to generate first and second supply voltages based on a symbol tracking signal, alternately select the first and second supply voltages for each symbol group section corresponding to a symbol group unit including at least one symbol to provide a supply output voltage capable of changing a voltage level for each symbol group section to the power amplifier,
wherein while the first supply voltage is being output as the supply output voltage in a first symbol group section, the second supply voltage is prepared to be output as the supply output voltage in a second symbol group section which occurs after the first symbol group section.

13. The symbol power tracking amplification system of claim 12, wherein the symbol group unit includes a variable number of symbols.

14. The symbol power tracking amplification system of claim 12, wherein the symbol tracking modulator is configured to receive a trigger signal indicating a time point in which a new symbol group begins, and alternately select the first and second supply voltages based on the trigger signal.

15. The symbol power tracking amplification system of claim 12, wherein the symbol tracking modulator is configured to change a level of the second supply voltage based on the symbol tracking signal in a symbol group section in which the first supply voltage is selected as the supply output voltage.

16. The symbol power tracking amplification system of claim 12, wherein a voltage transition of the supply output voltage occurs within a Cyclic Prefix section of a first symbol included in the symbol group section.

17. The symbol power tracking amplification system of claim 12, wherein the symbol tracking modulator comprises:
a first voltage supply circuit configured to generate the first supply voltage;
a second voltage supply circuit configured to generate the second supply voltage; and
a switch circuit configured to selectively connect one of the first voltage supply circuit and the second voltage supply circuit to the power amplifier.

18. The symbol power tracking amplification system of claim 12, wherein the first and second voltage supply circuits are configured to be DC-DC converters each supporting a DVS (Dynamic Voltage Sealing) function.

19. The symbol power tracking amplification system of claim 12, wherein the switch circuit is configured to connect the first voltage supply circuit to the power amplifier, and disconnect the second voltage supply circuit and the power amplifier in the first symbol group section,
wherein the second voltage supply circuit is configured to change the level of the second supply voltage based on the symbol tracking signal in the first symbol group section.

20. The symbol power tracking amplification system of claim 19, wherein the switch circuit is configured to connect the second voltage supply circuit to the power amplifier, and disconnect the first voltage supply circuit and the power amplifier in the second symbol group section,
wherein the first voltage supply circuit is configured to changes the level of the first supply voltage based on the symbol tracking signal in the second symbol group section.

* * * * *